US012794482B2

(12) United States Patent
Sundström et al.

(10) Patent No.: US 12,794,482 B2
(45) Date of Patent: Nov. 10, 2026

(54) SUCCESSIVE APPROXIMATION REGISTER-BASED REFERENCE ANALOG-TO-DIGITAL CONVERTER WITH LOW-COMPLEXITY DYNAMIC ELEMENT MATCHING

(71) Applicant: Telefonaktiebolaget LM Ericsson (publ), Stockholm (SE)

(72) Inventors: Lars Sundström, Lund (SE); Nikola Ivanisevic, Älvsjö (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 115 days.

(21) Appl. No.: 18/881,761

(22) PCT Filed: Jul. 8, 2022

(86) PCT No.: PCT/EP2022/069148
§ 371 (c)(1),
(2) Date: Jan. 7, 2025

(87) PCT Pub. No.: WO2024/008312
PCT Pub. Date: Jan. 11, 2024

(65) Prior Publication Data

US 2025/0317150 A1 Oct. 9, 2025

(51) Int. Cl.
*H03M 1/06* (2006.01)

(52) U.S. Cl.
CPC .................................. *H03M 1/0604* (2013.01)

(58) Field of Classification Search
CPC ...... H03M 1/0604; H03M 1/74; H03M 1/066; H03M 1/468; H03M 1/0665; H03M 1/10; H03M 1/1205
USPC ................. 341/118, 120, 144, 155, 153, 172
See application file for complete search history.

(56) References Cited

U.S. PATENT DOCUMENTS

| | | | | |
|---|---|---|---|---|
| 10,103,742 | B1 | 10/2018 | Guo et al. | |
| 10,868,558 | B1 * | 12/2020 | Tripurari | H03M 1/462 |
| 2011/0032134 | A1 | 2/2011 | Cho et al. | |
| 2018/0115317 | A1 * | 4/2018 | Fan | H03M 1/468 |
| 2019/0131986 | A1 * | 5/2019 | Vinje | H03M 1/0607 |
| 2022/0239302 | A1 | 7/2022 | Kinyua et al. | |

OTHER PUBLICATIONS

Ali, Ahmed M. A., et al., "A 14b 1GS/s RF Sampling Pipelined ADC with Background Calibration", 2014 IEEE International Solid-State Circuits Conference, Session 29, Data Converters for Wireless Systems, 29.3, Feb. 12, 2014, 1-3.

(Continued)

*Primary Examiner* — Peguy Jean Pierre
(74) *Attorney, Agent, or Firm* — Murphy, Bilak & Homiller, PLLC

(57) ABSTRACT

A switched-element digital-to-analog converter (DAC) circuit for use, for example, in a successive-approximation register, SAR, analog-to-digital converter, ADC. The DAC circuit comprises a pool of unary circuit elements (410), each having a common nominal weighting value, and switching (420) and multiplexer (430) arrangements configured so that each unary circuit element (410) in the pool can be independently associated with any one of two or more bits of the switched-element DAC.

19 Claims, 13 Drawing Sheets

(56) References Cited

OTHER PUBLICATIONS

Baird, Rex T., et al., "Linearity Enhancement of Multibit ΔΣ A/D and D/A Converters Using Data Weighted Averaging", IEEE Transactions on Circuits and Systems—II: Analog and Digital Signal Processing, vol. 42, No. 12, Dec. 1995, 753-762.
Bonnerud, Thomas E., et al., "A Mixed-Signal, Functional Level Simulation Framework Based on SystemC for System-on-a-Chip Applications", IEEE 2001 Custom Integrated Circuits Conference, 2001, 541-544.
Bugeja, Alex R., et al., "Design of a 14b 100MS/s Switched-Capacitor Pipelined ADC in RFSiGe BiCMOS", 2001 IEEE International Symposium on Circuits and Systems, vol. 1, Jun. 2001, 428-431.
Chan, Kok Lim, et al., "A 14b 100MS/s DAC with Fully Segmented Dynamic Element Matching", 2006 IEEE International Solid-State Circuits Conference, Feb. 8, 2006, 1-10.
Chan, Kok Lim, et al., "Dynamic Element Matching to Prevent Nonlinear Distortion From Pulse-Shape Mismatches in High-Resolution DACs", IEEE Journal of Solid-State Circuits, vol. 43, No. 9, Sep. 2008, 2067-2078.
Galton, Ian, et al., "A rigorous error analysis of D/A conversion with dynamic element matching", IEEE Transactions on Circuits and Systems II: Analog and Digital Signal Processing, vol. 42, No. 12, Dec. 1995, 763-772.
Galton, Ian, "Why Dynamic-Element-Matching DACs Work", IEEE Transactions on Circuits and Systems—II: Express Briefs, vol. 57, No. 2, Feb. 2010, 69-74.
Ginés, Antonio J., et al., "Novel swapping technique for background calibration of capacitor mismatching in pipeline ADCs", Proceedings of the 20th annual conference on Integrated circuits and systems design, Sep. 3, 2007, 21-26.
Jewett, Robert, "A 12 b 128 MSample/s ADC with 0.05 LSB DNL", 1997 IEEE International Solids-State Circuits Conference. Digest of Technical Papers, 1997, 1-3.
Jiang, Wenning, et al., "A 7.6mW 1GS/s 60dB SNDR Single-Channel SAR-Assisted Pipelined ADC with Temperature-Compensated Dynamic Gm-R-Based Amplifier", 2019 IEEE International Solid-State Circuits Conference, Session 3, NYQUIST Rate ADCs, 3.2, Feb. 18, 2019, 1-3.
Kim, Jaekwon, et al., "Design and Analysis of a 12-b Current-Steering DAC in a 14-nm FinFET Technology for 2G/3G/4G Cellular Applications", IEEE Transactions on Circuits and Systems—I: Regular Papers, vol. 66, No. 10, Oct. 2019, 3723-3732.
Obata, Koji, et al., "A 97.99 dB SNDR, 2 kHz BW, 37.1 μW Noise-Shaping SAR ADC with Dynamic Element Matching and Modulation Dither Effect", 2016 Symposium on VLSI Circuits Digest of Technical Papers, 2016, 1-2.
Tai, Hung-Yen, et al., "A 0.85fJ/conversion-step 10b 200kS/s Subranging SAR ADC in 40nm CMOS", 2014 IEEE International Solid-State Circuits Conference, Session 11, Data Converter Techniques, 11.2, Feb. 11, 2014, 1-3.
Tripathi, Vaibhav, et al., "A 160 MS/s, 11.1 mW, Single-Channel Pipelined SAR ADC with 68.3 dB SNDR", Proceedings of the IEEE Custom Integrated Circuits Conference, Nov. 6, 2014, 1-4.
Van De Plassche, Rudy J., et al., "A monolithic 14-bit D/A converter", IEEE Journal of Solid-State Circuits, vol. 14, No. 3, Jun. 1979, 1-5.
Yu, Qiang, et al., "A 9.08 ENOB 10b 400MS/s Subranging SAR ADC with Subsetted CDAC and PDAS in 40nm CMOS", IEEE 47th European Solid State Circuits Conference, 2021, 391-394.

* cited by examiner

Min H1/Hx [dB]
CW level [dBFS]
DEM - none
DEM - random circshift [0 1]
DEM - maximally randomized
100
90
80
70
60
50
40
-20
-18
-16
-14
-12
-10
-8
-6
-4
-2
0

H1/H3 [dB]
CW level [dBFS]
DEM - none
DEM - random circshift [0 1]
DEM - maximally randomized
120
110
100
90
80
70
60
50
40
-20
-18
-16
-14
-12
-10
-8
-6
-4
-2
0

SUCCESSIVE APPROXIMATION REGISTER-BASED REFERENCE ANALOG-TO-DIGITAL CONVERTER WITH LOW-COMPLEXITY DYNAMIC ELEMENT MATCHING

TECHNICAL FIELD

The present disclosure is generally related to analog-to-digital converters and digital-to-analog converters, and is more particularly related to dynamic element matching (DEM) in such converters.

BACKGROUND

Mobile and wireless communication technologies continue to evolve to meet the demand for increased data throughput. This is addressed on many levels, with different approaches including the use of higher-order modulation, multiple-input multiple-output (MIMO) communications, increased bandwidth, etc. With the introduction of higher frequencies for both cellular and wireless communication, and millimeter-wave (mmW) frequencies in particular, larger blocks of continuous spectrum are available, with bandwidths up to several GHz. At the same time, mobile base stations and wireless access points need to support increasingly large bandwidths to receive and transmit several carriers simultaneously, possibly distributed across several bands, to stay cost efficient. Regardless of the type of equipment, the trend is clear: there is a strong push for communication using larger and larger bandwidths.

One important challenge related to large bandwidths is the implementation of analog-to-digital converters (ADC), as found in wireless receivers. To accommodate large bandwidths while being reasonably power efficient, so-called time-interleaved ADCs (TI-ADC) are commonly used. A basic time-interleaved ADC consists of M sub-ADCs, each operating at the same sample clock frequency fs but at different phases of that same clock, so as to effectively yield an aggregated conversion rate of M×fs, when the outputs of the sub-ADCs are recombined. The time-interleaving is necessary because the individual sub-ADCs cannot be designed to operate accurately and/or power efficiently at the aggregated conversion rate of M×fs.

ADCs, and TI-ADCs in particular, often do not provide good enough performance by design, e.g., in terms of linearity and various other effects that lead to distortion components and spurs. In TI-ADCs, various spur contributions may originate from mismatches between sub-ADCs and/or between groups of sub-ADCs in terms of gain, DC offset, sample time skew, group delay, and nonlinearity. To address this, the ADC (the "main" ADC, from hereon) is often accompanied by means to estimate various undesired errors and correct for them in the digital domain, i.e., after conversion, and/or by calibration of blocks in the analog domain. In addition to these estimation and correction means, there is also often a reference ADC that samples and process the analog input signal in parallel with the main ADC, or "primary" ADC. The combination of the main ADC and reference ADC is referred to as an ADC system. The reference ADC may have substantially better linearity compared to the main ADC, and thus may be used to provide an output that can be compared to the output of the main ADC or the sub-ADCs, to estimate at least some of the errors discussed above. It might be non-time-interleaved, for example, and thus without the errors associated with interleaving, while the SNR can be significantly lower. The reference ADC may instead or also operate at a substantially lower sample rate, compared to the main ADC. It may also sample in an irregular pattern over time, i.e., with sampling not being time-equidistant, or it may sample in a regular pattern over time so at to cyclically align with different phases of the sampling of the main ADC corresponding to different sub-ADCs.

ADC design is often based on the successive-approximation register (SAR) technique, as this design is known to be power efficient, while scaling well with CMOS process technology evolution. The SAR ADC operation is an iterative process with a number of decision cycles. In its most basic and common form only one binary decision is made per cycle, typically representing whether a voltage is larger or smaller than some threshold voltage. FIG. 1 illustrates the basic operation for an example implementation. As seen in the figure, a signed input signal sample $s_{in}$ to be converted is fed to a comparator 110, to determine the sign of the signal, i.e., whether it is larger or smaller than a reference value (not shown in FIG. 1), e.g., zero (0V). The comparator result, i.e., a "1" or a "0," depending on whether $s_{in}$ is larger or smaller than $s_{dac}$, is stored in a register, in state machine 120, that in turn outputs its content (decisions d[0:n]) to a DAC 140 that generates $s_{dac}$, an iteratively updated approximation of $s_{in}$ that starts at the reference value (e.g., zero) and successively gets closer and closer to $s_{in}$. At each cycle/iteration, $s_{dac}$ is subtracted from $s_{in}$ to generate a residue $s_{res}$ which is used as the input to the comparator for the next decision cycle and so on. The DAC contains a number of weights w[0:n] associated to the SAR ADC output decisions d[0:n]. Before a decision has been made for a given weight w[k] in the DAC, the weight may output zero. Once the decision has been made then either +w[k] or −w[k] is output. Thus, prior to any decision being made for an input sample, the $s_{dac}$ outputs zero which means $s_{res}=s_{in}$.

To generate the ADC output signal s[k] approximating the input signal $s_{in}$, the decisions d[0:n] are weighted and combined by summer 130, using weights ŵ[i] that ideally match the weights w[i] in the DAC. When the weights are binary scaled, this combining obviously becomes trivial, as in this case d[0:n] itself then becomes a digital representation of the analog input sample.

Due to the sequential nature of the decisions and subsequent changes of the DAC output, the conversion speed of SAR ADCs is quite limited, leading to sample rates seldom exceeding 1 Gsps and often at or less than a few 100 Msps. When designing SAR ADCs, much attention is therefore paid to minimizing the delay accumulated in the SAR loop due to comparator decision time, the delay in distribution of control signals to the DAC, and the settling of the DAC after each change of state.

Although other designs are possible, one power-efficient category of SAR ADCs uses the so-called capacitive DAC (C-DAC), where capacitive elements are used both for the signal weighting and combining in the DAC and as a sample-and-hold capacitance to hold the input sample for the ADC. FIG. 2 shows an example of an $N_b$-bit C-DAC that consists of $N_b$ binary-weighted capacitors, each connected to a 4-to-1 switch, or analog multiplexer, labeled MUXw[i] in the figure, and a top plate switch, labeled top_sw. The inputs to the C-DAC are the analog input voltage, Vin,ana, and three voltage references: one for common mode, Vref,cm, and two for defining the quantization range, Vref,p and Vref,m. In some implementations, the common mode voltage Vref,cm is ground, or zero volts, while Vref,m=−Vref,p.

The operation of the C-DAC is divided into a sampling phase (also referred to as tracking phase) and a bit-cycling (or hold) phase. The order of the phases is commutated by the switches/multiplexer, which are commonly implemented as CMOS transmission gates. The states of the analog multiplexers are controlled by the successive approximation register (state machine), which is not shown explicitly in FIG. 2, for simplicity. Instead, the states of the multiplexer are enumerated from 1 to 4.

For the conventional switching scheme, in the first multiplexer state (1) the Vin,ana voltage is connected to the bottom plate of all capacitors, while the top_sw connects all top plates to the Vref,cm voltage. Thereafter, the multiplexer is changed to its second state (2) by the state machine, which disconnects the Vin,ana and instead connects the Vref,cm to the bottom plates. At the same time, the switch top_sw is opened, and the DAC output VCDAC,out, which corresponds to $s_{res}$ in FIG. 1. In this way, the input Vin,ana is stored as charge, distributed across all capacitors, and is referred to Vref,cm which makes it possible for the comparator (shown in FIG. 1) to determine the relative polarity of Vin,ana. The following two states, 3 and 4, are mutually exclusive and happen in an orderly or incremental manner for each weight, starting from the most significant weight w[n]. At each step, either Vref,p or Vref,m will be applied to aa given one of the binary-weighted capacitors, instead of Vref,cm, based on the previous comparator decision. The process then repeats until each weight/bit has been applied. As a result of this process, the VCDAC,out voltage reduces gradually, with each weight, such that the remaining residue is equal to the quantization error of the DAC.

The matching of the weights in the DAC is of utmost importance to make the ADC linear as the decision combining to generate the ADC output signal relies on weights being the assumed ones, in other words $$\sum_{i=0}^{n} d[i]w[i] \sim \sum_{i=0}^{n} d[i]\hat{w}[i].$$

Note that the operator "~" means "proportional to," in the previous expression. In the example shown in FIG. 2, the DAC weights are implemented with the weighting capacitors—for optimal linearity it is important that the capacitances match their expected values, or, at least that the ratios between the values match the expected ratios. Thus, for example, given the binary weights shown in FIG. 2, each capacitance starting with the most significant weight ($2^n C_u$) should be as close as possible to exactly twice the capacitance of the next most significant weight.

Various techniques are used to minimize weight mismatch. The most common is to implement all weights using the same unit cell design, e.g., a unit capacitor, where each weight is based on an integer number of such cells. This is suggested by FIG. 2, where $C_u$ is the unit capacitance value. The switches in the multiplexers of the C-DAC often are scaled accordingly to the weight as well, so that any internal capacitances, for example, are appropriately scaled.

However, even with a unit cell approach, there will be errors in the weight. These errors originate from limited accuracy in manufacturing, which can be reflected in local mismatch between unit cells in the same region of an integrated circuit, as well as gradients across an array of unit cells. An example distribution of unit cell capacitances can be seen in FIG. 3. The magnitude of local mismatch and process gradients vary, depending on physical dimensions of the unit cells and the accuracy of the manufacturing technology.

One of the largest issues with weight mismatch in the context of a SAR-based ADC is that it leads to the ADC exhibiting a static nonlinearity, often reported as integral nonlinearity (INL) and differential nonlinearity (DNL). This leads to harmonic distortion and thus limits the spurious-free dynamic range (SFDR) performance. And worse still, as opposed to conventional analog nonlinearities, it does not necessarily improve when the input signal level decreases. In some applications, it is this nonlinearity that constitutes the largest challenge.

The magnitude of the error introduced may not be a problem in itself if it can be made into noise using scrambling or randomization schemes. One common approach is to use dynamic-element matching (DEM), which randomly reallocates unit cells to different weights over time. So, while the errors as such do not disappear, they no longer manifest themselves as harmonic distortion. Rather, the errors become noise-like, continuously distributed across the frequency spectrum. Another related technique often found in Delta-Sigma ADCs is data-weighted averaging, where the ADC output data is used to control the unit-cell shifting, in such a way that the associated noise becomes colored, with little contribution in the signal bandwidth, at the expense of more noise in frequency ranges that anyway will be filtered out. A multitude of schemes have been implemented, with respective advantages and disadvantages in terms of complexity, power consumption, and spectral properties.

Problems with respect to linearity can be particularly acute in the context of a reference ADC, where linearity requirements may be especially stringent. Having a SAR-based reference ADC in an ADC system for the purpose of estimating at least nonlinear distortion in the main ADC is often not possible, as the SAR-based reference ADC might itself not be linear enough by design, but would then need error estimation and correction on its own.

While the actual ADC weights, and/or their mismatch, can be estimated using a well-defined (i.e., precisely known) test signal input to the reference ADC, such a test signal generator is non-trivial to build, as it would suffer from similar problems as the ADC that is supposed to be characterized. The test signal would furthermore need to be swept in frequency and in amplitude to enable an accurate estimation of the weights.

Furthermore, conversion speed of a SAR ADC is limited due to its sequential decisioning nature. While it might be tempting to apply weight randomization (DEM), this can cause substantially longer conversion time, and therefore a lower sample-conversion rate.

SUMMARY

These problems may be addressed with an ADC system having a main ADC and a reference ADC, the latter being based on a SAR ADC, where the reference ADC exhibits a substantially better linearity than the main ADC, and where the reference ADC output is used to provide a more linear representation of the input signal compared to the main ADC. This will be used as reference when estimating at least nonlinearity in the main ADC.

The linearity of the reference ADC is improved by using a low-complexity DEM technique in reference to the SAR ADC. The low-complexity DEM technique is based on each unit cell in the SAR ADC having a unit cell register associating said each unit cell to a particular decision bit d[k] for a given cycle of the successive approximation procedure, where randomization is limited to either keeping a unit cell register's setting for a subsequent cycle or shifting the unit cell register value to an adjacent unit cell, for all unit cells. Thus, unit cells used to form the DAC in the SAR ADC are arranged in the form of a cyclic shift register.

At the core of such a solution may be certain embodiments of an inventive switched-element digital-to-analog converter (DAC) circuit. Various embodiments of this DAC circuit comprise a pool of unary circuit elements, each having a common nominal weighting value. The unary circuit elements may be unit capacitors, for example, each having a nominal capacitance. The DAC circuit further comprises a switching arrangement of one or more switches, for each unary circuit element in the pool, where switching arrangement is configured to independently and selectively connect the respective unary circuit element to a first circuit node, (e.g., a reference voltage) or to one of a set of nodes including first and second circuit nodes, under the control of one or more respective control inputs to the switching arrangement. The DAC circuit still further comprises a multiplexer for each respective unary circuit element in the pool, each multiplexer having (a) one or more output lines connected to respective ones of the one or more control inputs of the switching arrangement corresponding to the respective unary circuit element, (b) two or more sets of input lines, each set having input lines corresponding in number to the number of the one or more output lines, and (c) one or more input selection lines. Each multiplexer is configured such that signal values applied to the input selection lines control which one of the two or more sets of input lines is connected to the respective one or more output line. Finally, the DAC circuit comprises a shift register circuit comprising a register element for each one of the plurality of multiplexers, each register element having one or more register element lines connected to respective ones of the one or more input selection lines for the respective multiplexer, the register elements being configured in a loop configuration so that each cycle of a shift register clock signal shifts signal values output by register element lines of a given one of the register elements to a next-in-line one of the register element. The two or more sets of input lines for each multiplexer comprise a set of input lines for each of two or more bits of the switched-element DAC, such that the signal values applied to the input selection lines of the multiplexers select which of the unary circuit elements are associated with which of the two or more bits.

These DAC circuits are described in more detail in the detailed description that follows, as are various techniques for using such DAC circuits and example SAR-based ADC circuits and ADC systems that employ such DAC circuits. As will be appreciated upon reading the following description and viewing the attached figures, the techniques and circuits described herein may be used to improve the linearity and spurious outputs of high-speed ADC circuits, without unduly increasing circuit complexity and power consumption.

DETAILED DESCRIPTION

As briefly noted above, the linearity of an ADC, such as a reference ADC in an ADC as described above, is improved by using a low-complexity DEM technique in reference to a SAR ADC. The low-complexity DEM technique is based on each of several unit cells, or "unary circuit elements," in the SAR ADC having a unit cell register associating said each unit cell to a particular decision bit d[k] for a given cycle of the successive approximation procedure, where randomization is limited to either keeping a unit cell register's setting for a subsequent cycle or shifting the unit cell register value to an adjacent unit cell, for all unit cells. Thus, unit cells/unary circuit elements used to form the DAC in the SAR ADC are effectively arranged in the form of a cyclic shift register.

The term "unary circuit element" is used herein to any one of several nominally identical circuit elements in a circuit, particularly in an integrated circuit, each having a nominal parameter value, or "weighting value." The unary circuit elements are typically selected and/or formed to have an actual parameter value as close as is practical to the nominal parameter value, allowing for process tolerances and the like. Several of these unary circuit elements can be combined to form a combined circuit element having a parameter value, or weight, that is equal to the nominal value times the number of unary circuit elements that are combined. In the examples illustrated herein, the unary circuit elements are capacitive element, as employed in a switched-capacitor DAC. In other embodiments or applications of the techniques described herein, however, the unary circuit elements might be, for instance, resistors, each having a nominal resistance value, or current sources, each having a nominal current output.

Figure 4A:
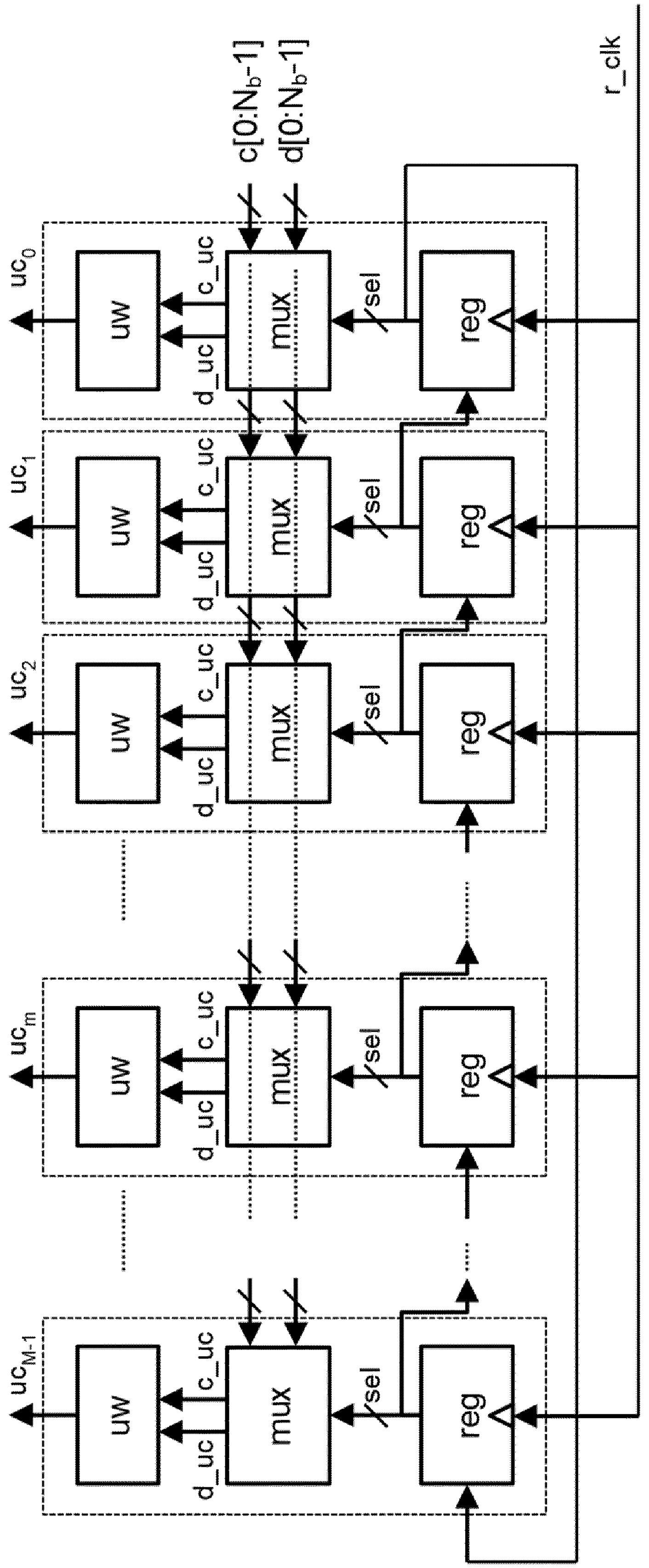
FIG. 4A illustrates elements of an example DAC circuit, according to embodiments of the presently disclosed techniques and circuits.
Figure 4B:
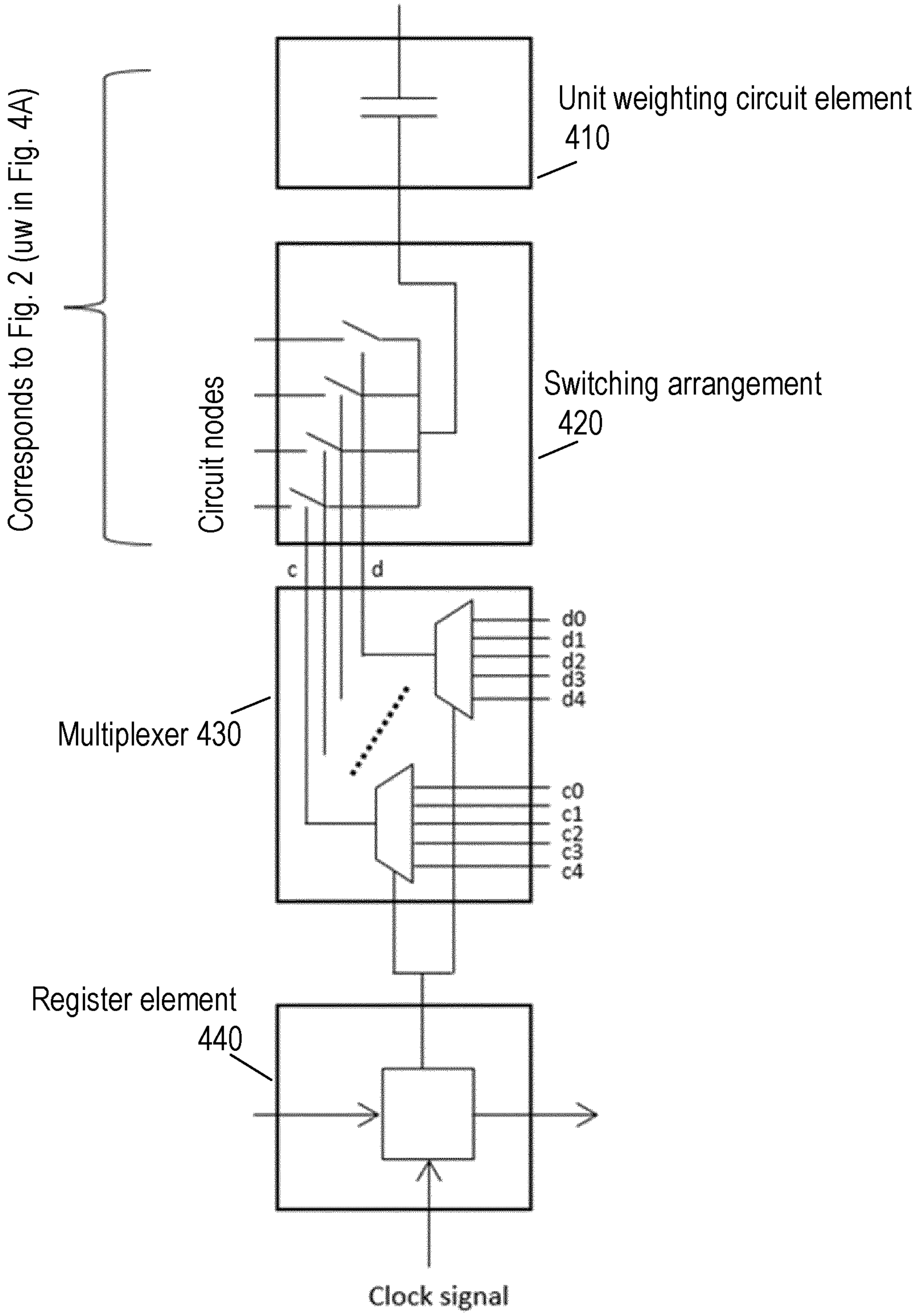
FIG. 4B illustrates additional details of the unit cells of FIG. 4A.

The principle of the proposed DEM technique is outlined in FIG. 4A, which illustrates a portion of a switched-element DAC, e.g., a switched-capacitor DAC used in a SAR ADC, and FIG. 4B, which provides additional details of a unit weight cell. This switched-element DAC comprises a set of M unit cells, each comprising a unary circuit element 410 (such as a unit capacitor) and a switching arrangement 420 coupled to the unary circuit element 410. In FIG. 4A, these are combined in the blocks labeled "uw," for unit weight. Additional example details of the unit cell are shown in FIG. 4B—in this figure, the unit weight ("uw") in FIG. 4A comprises a unit weight cell 410, in this case a unit capacitor, and a switching arrangement 420 configured to selectively connect the unit capacitor to one of four circuit nodes.

Figure 1:
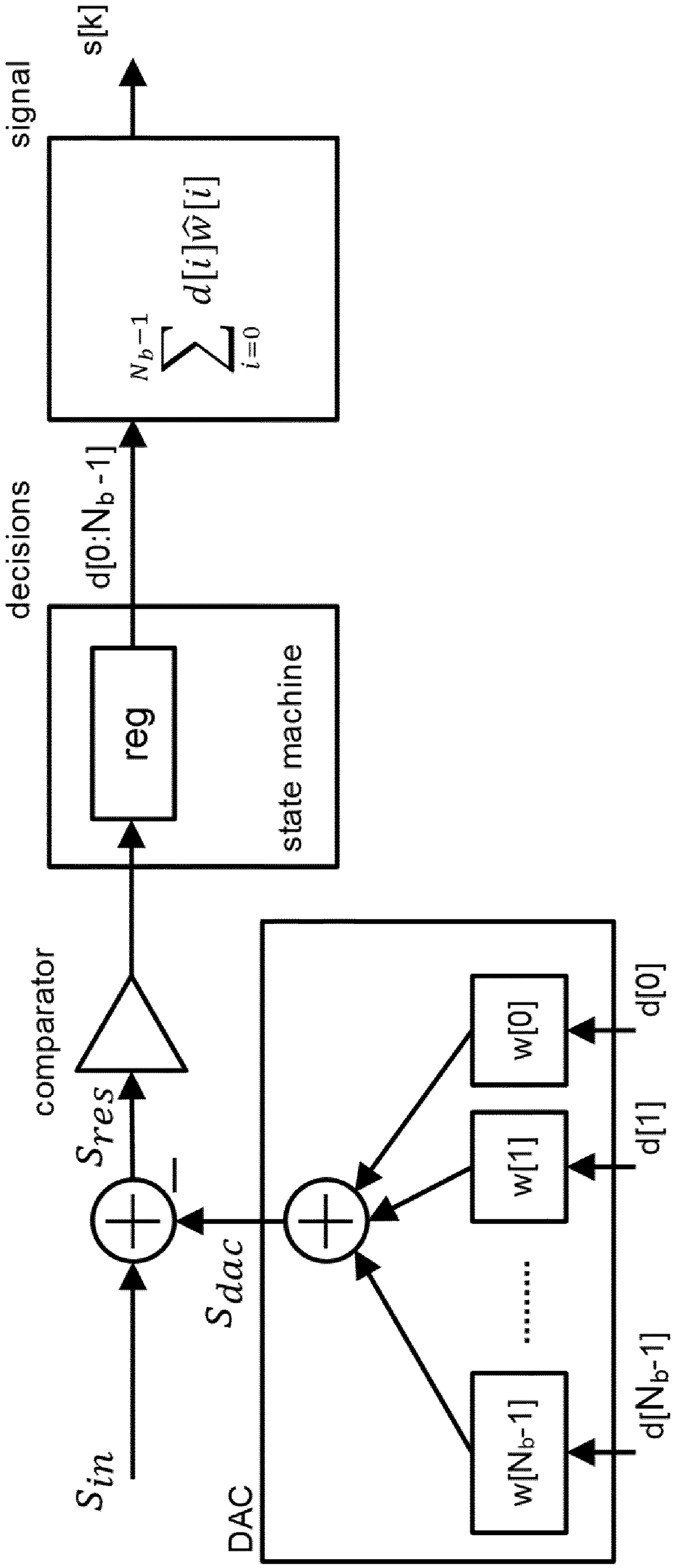
FIG. 1 is a simplified view of a SAR DAC.
Figure 2:
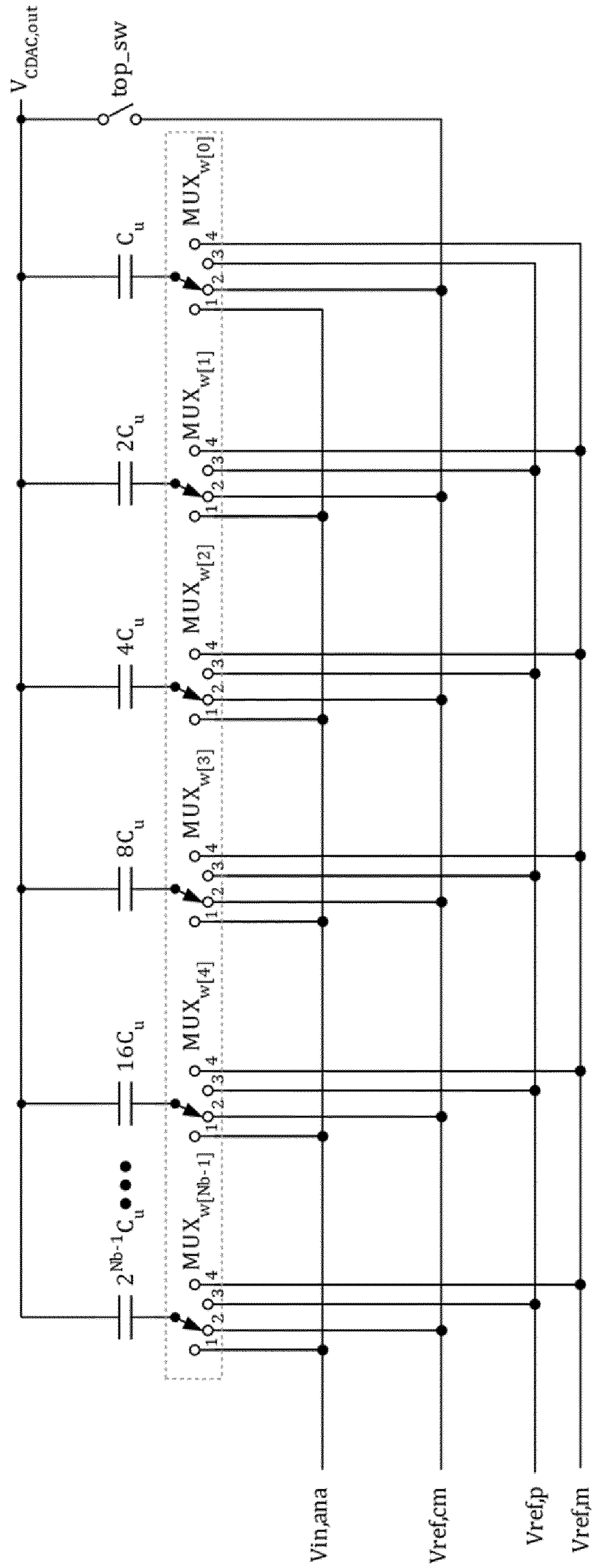
FIG. 2 is a schematic diagram of a capacitive DAC circuit.
Figure 3:
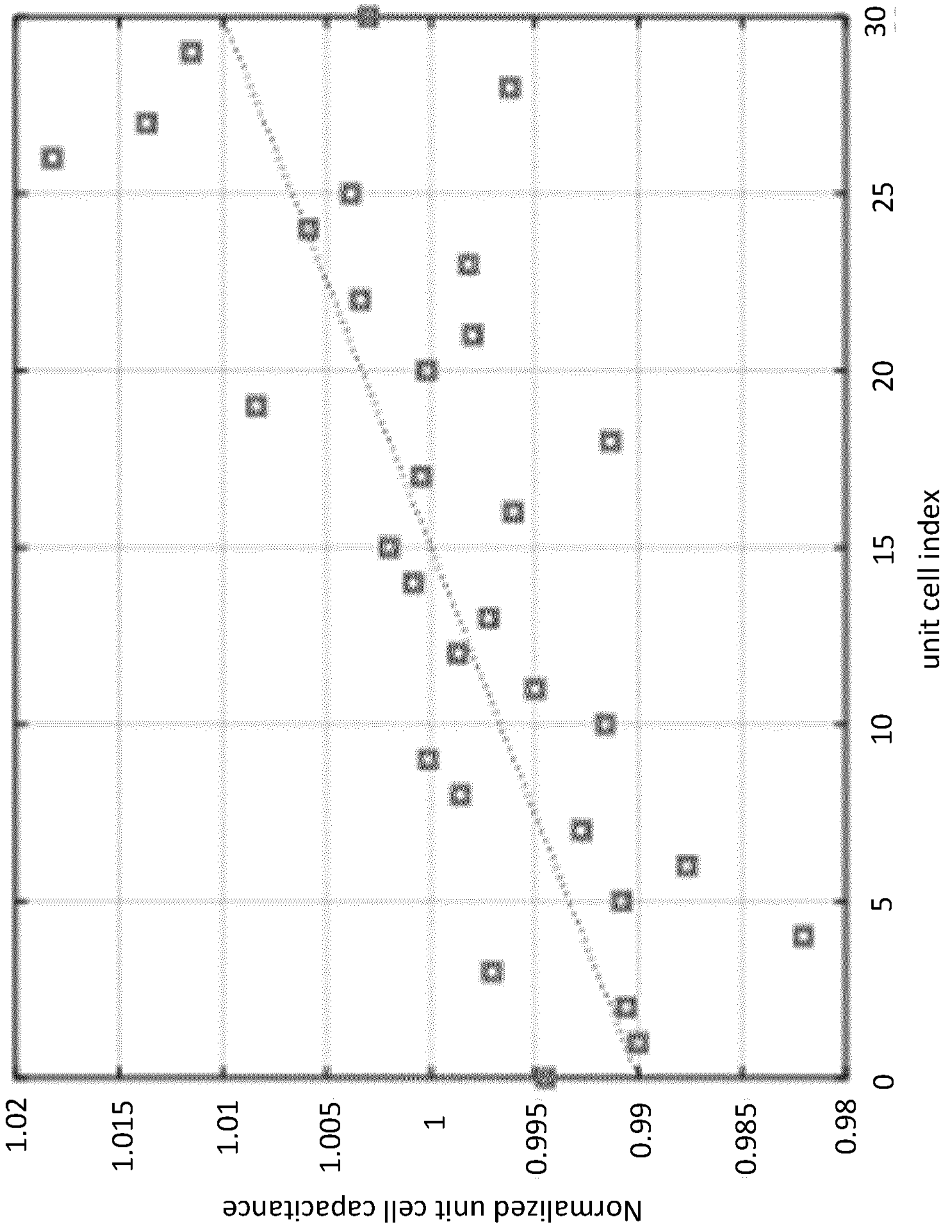
FIG. 3 shows an example of normalized unit cell capacitance across a vector of thirty-one unit cells.

Referring back to FIG. 4A, in this example there are two control inputs shown, for each unit cell, labeled c_uc and d_uc. These two control inputs might control the switching arrangement to selectively connect one end of the unit capacitor to one of a positive reference voltage, a negative reference voltage, or a neutral reference voltage, for example, e.g., as shown in the C-DAC circuit illustrated in FIG. 2. More generally, there can be more or fewer control lines, and these control lines can be configured to switch a unary circuit element 410 into one of multiple states.

The control inputs c_uc and d_uc for each unit cell are independent of the control inputs for the other unit cells. The control inputs for each unit cell can be configured to be connected to switch control signals associated with any one of the decision bits from the SAR register. In this example, there are two switch control signals for each of N decision bits. These switch control bits are shown in FIG. 4A as $c[0:N_b-1]$ and $d[0:N_b-1]$.

As shown in FIG. 4B, each unit cell $uc_m$ shown in FIG. 4A contains a unit weight uw (containing the unary circuit element 410 and its respective switching arrangement 420), a multiplexer 430, or "mux," for switch control signal selection, and a unit cell register 440, "reg," holding a setting (sel[.]) for the mux. The select lines ("sel") for each mux 430 select a pair of switch control signals from among the pairs of switch control signals $c[0:N_b-1]$ and $d[0:N_b-1]$. Thus, the switch control signals, ($c[0:N_b-1]$ and $d[0:N_b-1]$ in this example), are connected to all unit cells, to allow any given set of unit cells to "subscribe" to the pair of switch control signals for any given one of the N decision bits. Additional details of an example mux are shown in FIG. 4B.

Again, various implementations of the techniques described herein may use different sorts of unary circuit elements and different control schemes for these unary circuit elements. Thus, as for the pairs of control signals $c[0:N_b-1]$ and $d[0:N_b-1]$ used in the example, anyone skilled in the art of SAR ADC design will recognize that there are different SAR switching schemes and implementations that use different numbers of switch control signals and often more than two per DAC bit. The proposed DEM technique can be applied regardless of the type and number of switch control signals per bit. Also worth noting is that the N decision bits discussed here might represent all of the bits of an N-bit SAR ADC, but could also correspond to only a subset of a SAR ADC having more than N bits, in some embodiments.

It will be appreciated that the combination of multiplexers and unit weights shown in FIG. 4A would, given complete independence between the "sel" lines controlling the multiplexers, provide complete flexibility in mapping the switch control signal pairs to individual unit weights. Thus, this arrangement would allow any arbitrary mapping, at any time. However, this would require that every signal select line, in the illustrated example, M*log 2(N) select lines, be separately routed to a control point, e.g., a microprocessor and/or digital logic controlling the circuit operation. This complicated routing is simplified, according to the presently disclosed by techniques, by arranging the unit cell registers so that they form a circular shift register that preferably aligns with the physical circuit layout such that adjacent unit cells in FIG. 4A are also adjacent in the circuit layout. This is illustrated in FIG. 4A, which shows that the select lines output from each register are connected not only to the respective mux, but also to the input of the immediately adjacent register.

So, upon being clocked by the common clock signal r_clk, the select line data stored in each unit cell register is shifted to the next unit cell register. This forms a compact DEM solution that makes it possible to integrate the DEM functionality tightly as part of the C-DAC in the SAR ADC, thereby avoiding a huge number of control signals that would otherwise have to be routed from a control point outside of the SAR ADC. Another important feature is the small logic-depth contribution to the SAR loop, with only a mux between the switch control bits for each decision bit and the switching arrangement connected to the unary circuit element, yielding the lowest possible impact in SAR loop delay. However, the circular shift register does not necessarily need to be tightly integrated with the SAR loop. As the sel [.] signals are only changing at the sampling rate of the C-DAC or lower, the circular shift register can be placed elsewhere, in which case the sel[.] signals then need to be routed from the circular shift register into the switched-element DAC core.

Before the circuit shown in FIG. 4A is used to convert a signal, the unit cell registers may each be individually initialized with bit association values, i.e., pre-loaded with output values for the "sel" lines, when a reset signal goes active. Alternatively, unit cell register data may be pre-loaded into the registers in serial fashion, by opening up the circular shift register and shifting in settings from the outside, at a single entry point to the circular shift register, by generating a number of r_clk pulses equal to the number of unit cell registers in the circular shift register while providing a corresponding sequence of bit association data. This can be done once at startup or regularly during operation, albeit requiring that conversion is temporarily halted till the new bit association pattern have populated the unit cell registers. A key advantage of this approach is that the initial settings for the circular shift register, and thus the initial association of unary weighting elements to particular bits of the DAC, can be arbitrarily set, at run-time.

The initialization using a serial approach as described above is also advantageous in that the existing short connections between adjacent unit cell registers are used for pre-loading the registers, thereby avoiding the need for a wide data bus that consumes valuable area. This is especially valuable when the circular shift register is tightly integrated with the C-DAC. A disadvantage with this approach, on the other hand, is that it takes time to populate the circular shift register with a new bit association pattern. This time could be reduced, however, by loading the circular shift register from multiple points evenly spaced around the loop, in some embodiments. In implementations where the circular shift register needs to be populated with a new bit association pattern as fast as possible, the circular shift register could have a wide data bus that would allow the entire circular shift register to be populated using only one r_clk pulse.

Figure 5:
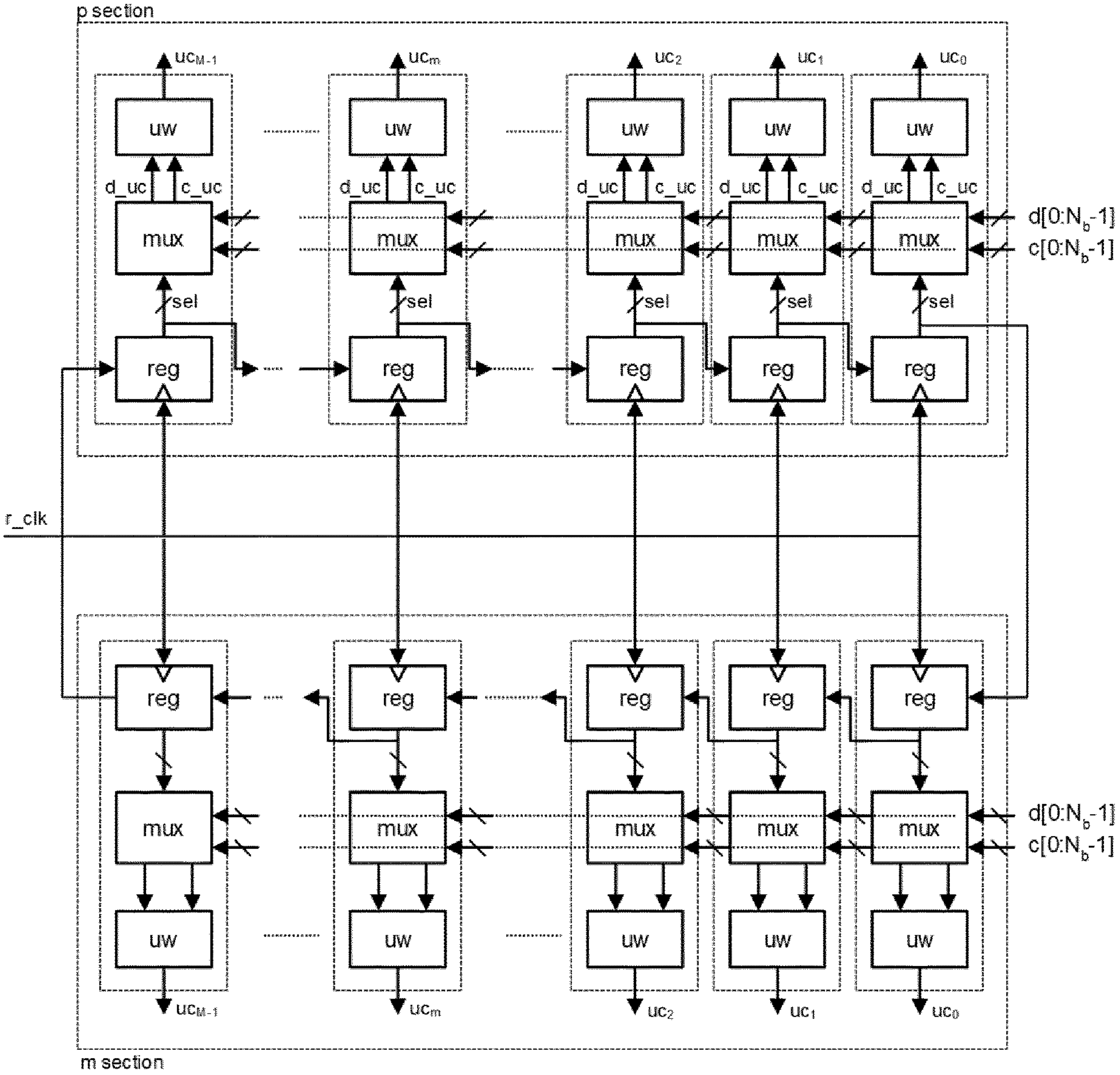
FIG. 5 is a block diagram illustrating an example embodiment using a single circular shift register running through differential sections.

FIG. 4A is intended to illustrate the concept generally, and thus the unit weights illustrated in the figure may represent weights that are electrically either single-ended or differential. In the case of a differential CDAC, however, the DEM technique can be independently implemented for the differential p(lus) and m(inus) sections, i.e., with a loop of registers forming a circular shift register for the positive side and another loop of registers forming a second circular shift register for the negative. The r_clk clock may have different sequence patterns for the two sections. Another alternative is outlined in FIG. 5 where the circular shift register now includes both sections and hence is clocked by a single r_clk signal. This is advantageous because a ring can be naturally formed, leading to a shorter routing distance between edge registers.

Figure 6:
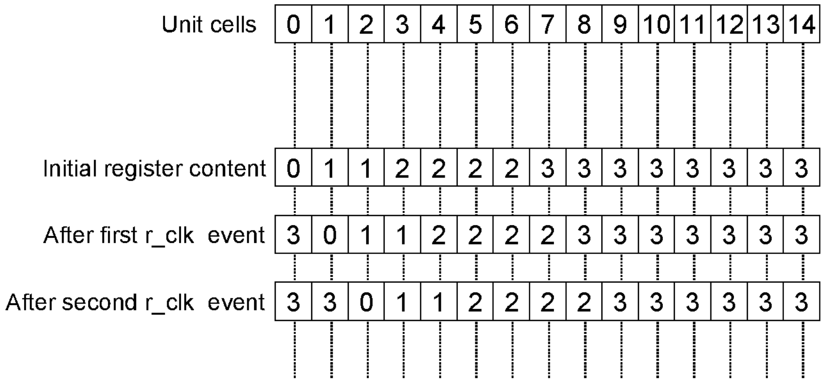
FIG. 6 illustrates a basic association of DAC bits to unit cells in a bit association shift register, according to some embodiments.

FIG. 6 illustrates an example of the content of the bit association shift registers from initial setting and over several r_clk events. The initial setting of the shift register is in this case trivial, for clarity, with the first unit cell being initially associated with d[0], the second and third unit cell with d[1], the next four unit cells with d[2], etc. At each r_clk event, the data is simply circulated. While FIG. 6 illustrates an orderly initial pattern, the initial register content may be distributed differently from what is shown in this example, e.g., to more effectively scramble the effect of process gradients. A common-centroid initial distribution might be used, for example.

Having the bit association pattern reconfigurable provides for flexibility in selecting the initial bit association pattern, which in some circumstances might lead to a lower weight error (and hence a more linear DAC) before DEM randomization is applied. One might also consider a totally random association of all unit weights as an optimum solution. In implementations using the presently disclosed techniques, the ability to distribute the associations between unary circuit weights and ADC bits in a completely random fashion is already present as part of the DEM technique.

Figure 7:
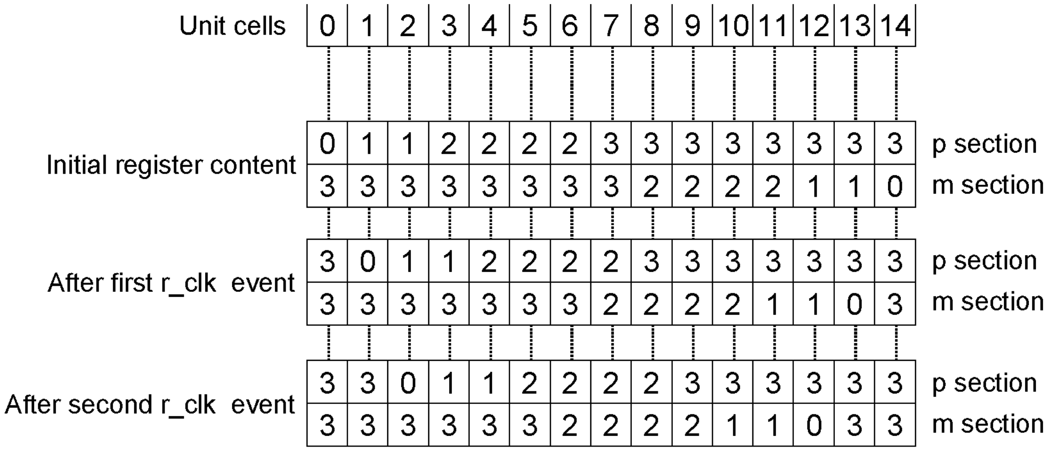
FIG. 7 shows an example association of DAC bits to unit cells in a bit association shift register running through differential sections of a DAC, according to some embodiments.

FIG. 7 shows the corresponding case for the when the shift register runs through both the differential sections. Initial register content should be identical for the two sections except that one is flipped. This effectively means that the right-side output of the p section register is connected to the right-side input of the m section register. This configuration reduces the impact of process gradients, causing gradual value shift along the axis along which the unit cells have been laid out.

In all of the illustrated embodiments, the register clock signal r_clk generates a pulse whenever a shift should take place. This need not happen at each sample time, however. A sequence generator may be used to determine whether the pulse is to be generated or not after each conversion of a sample has completed. The sequence generator can be configured so that it's output is random or pseudo-random. In one embodiment, a random number generator (RNG) is used to generate a random value at each sample time. Each draw from the RNG is compared to a reconfigurable threshold value. If the RNG value is larger than or equal to the threshold value, for example, the sequence generator will cause an r_clk pulse to be generated for the corresponding sample time, otherwise not.

In the following, simulation results are presented for an ADC consisting of a 10-bit binary scaled SAR ADC, where the proposed technique is applied to the 5 most significant bits. The associated unit cell values in this simulation have a standard deviation of 0.5%, with a Gaussian distribution, to represent the mismatch variation. When the proposed DEM technique is used in this simulation, the sequence generator uses an RNG that generates a random value [0,1). As discussed in further detail below, the threshold for determining whether or not a r_clk pulse is generated at any given sample time is set to either 0.5 or 0.75.

Figure 8:
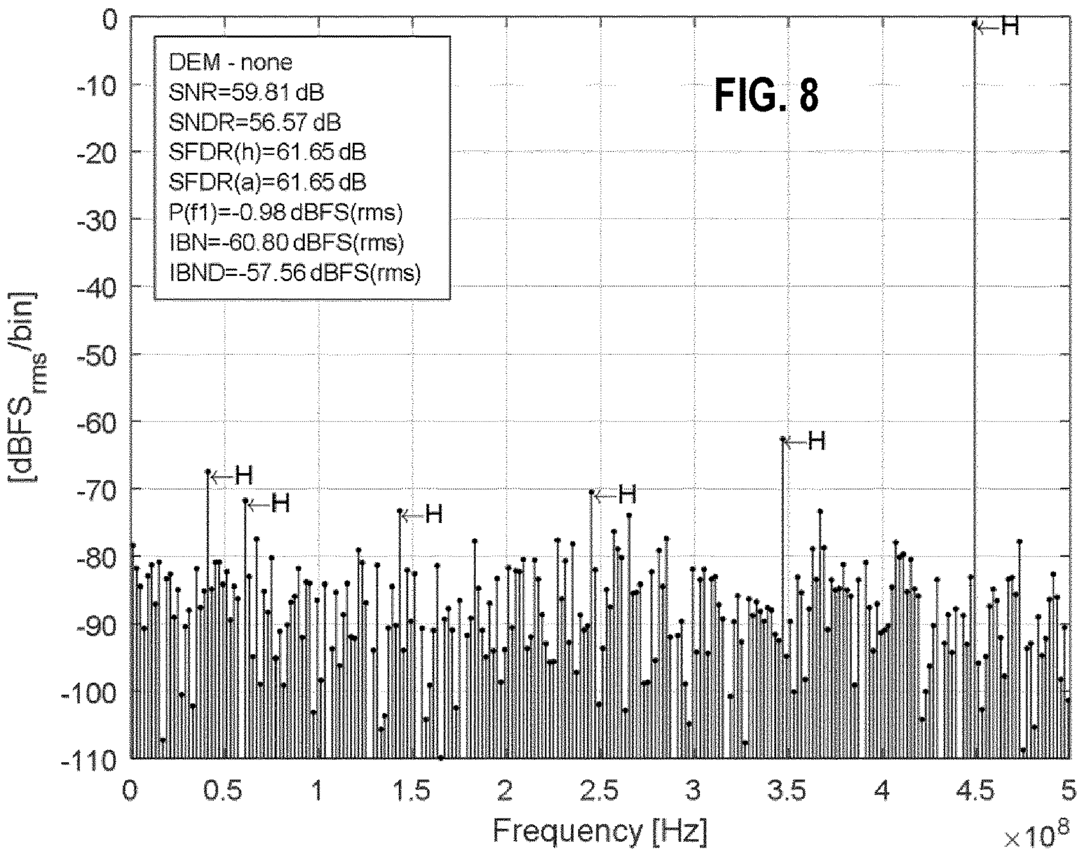
FIG. 8 illustrates an example output signal spectrum with unit cell mismatch and without using the techniques described herein.
Figure 9:
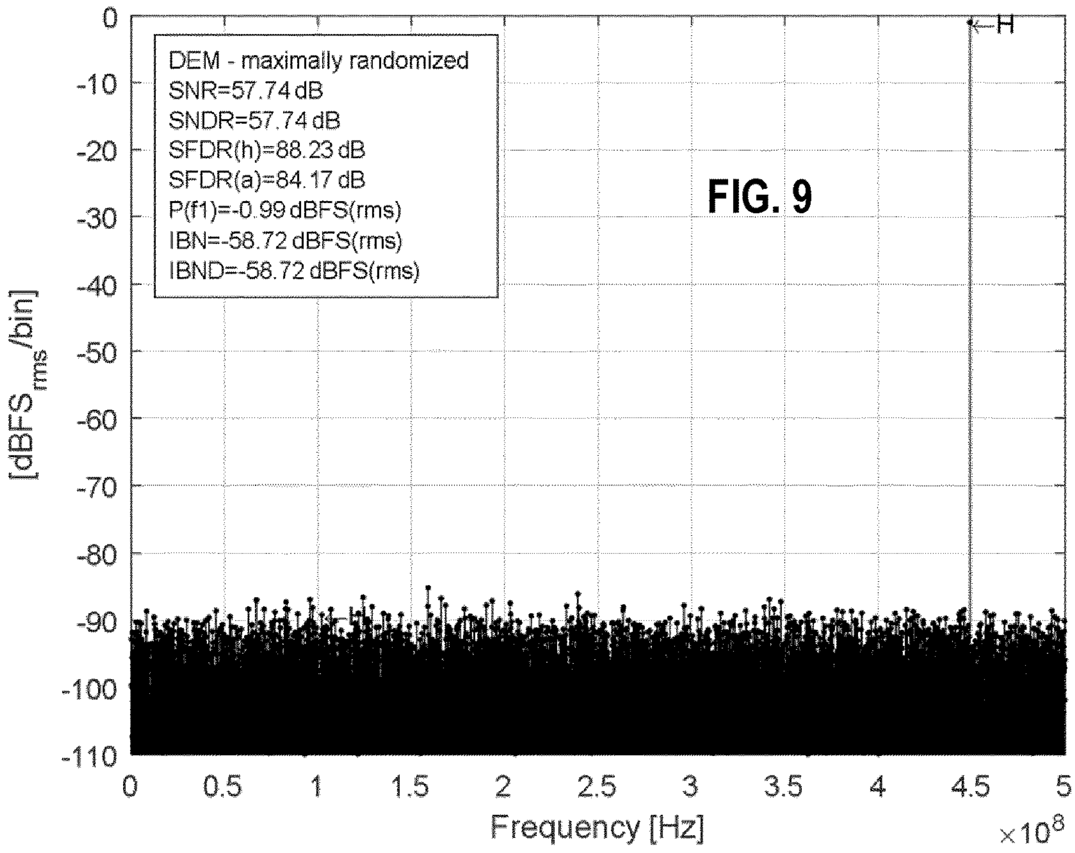
FIG. 9 shows the output signal spectrum with the same unit cell mismatch and using maximally randomized dynamic element matching (DEM).
Figure 10:
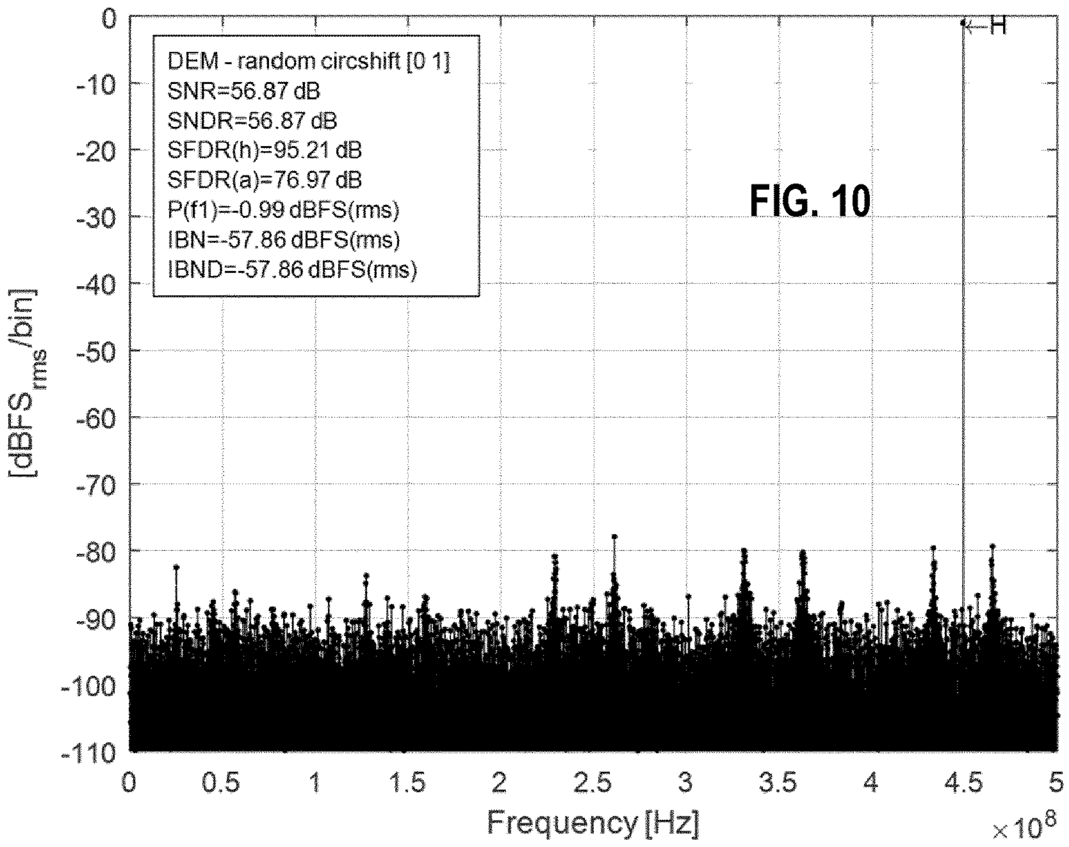
FIG. 10 shows the output signal spectrum for the same unit cell mismatch and using the techniques described herein, for a 50% probability of shift at each shift opportunity.

FIG. 8 illustrates an example output spectrum for the ADC (based on one realization of unit cell values) when no DEM technique is used to mitigate the mismatch. FIG. 9 shows an example spectrum when a maximally randomized DEM technique is used to mitigate the mismatch. Here, maximally randomized means that the DEM has no restriction on unit cell bit association and, more importantly, there is no dependency on the bit association from a previous state, as is the inevitable effect from using the DEM techniques described herein. FIG. 10 shows an example spectrum using the DEM techniques described herein, with a threshold equal to 0.5, meaning the probability for a shift in the circular shift register is 50%. As can be seen, the spectrum in FIG. 10 includes several spurs that are several dB higher than the peak noise levels in the fully randomized DEM simulation represented by FIG. 9. But, these spurs are considerably lower than the highest spurs in FIG. 8, where no DEM is used.

Figure 11:
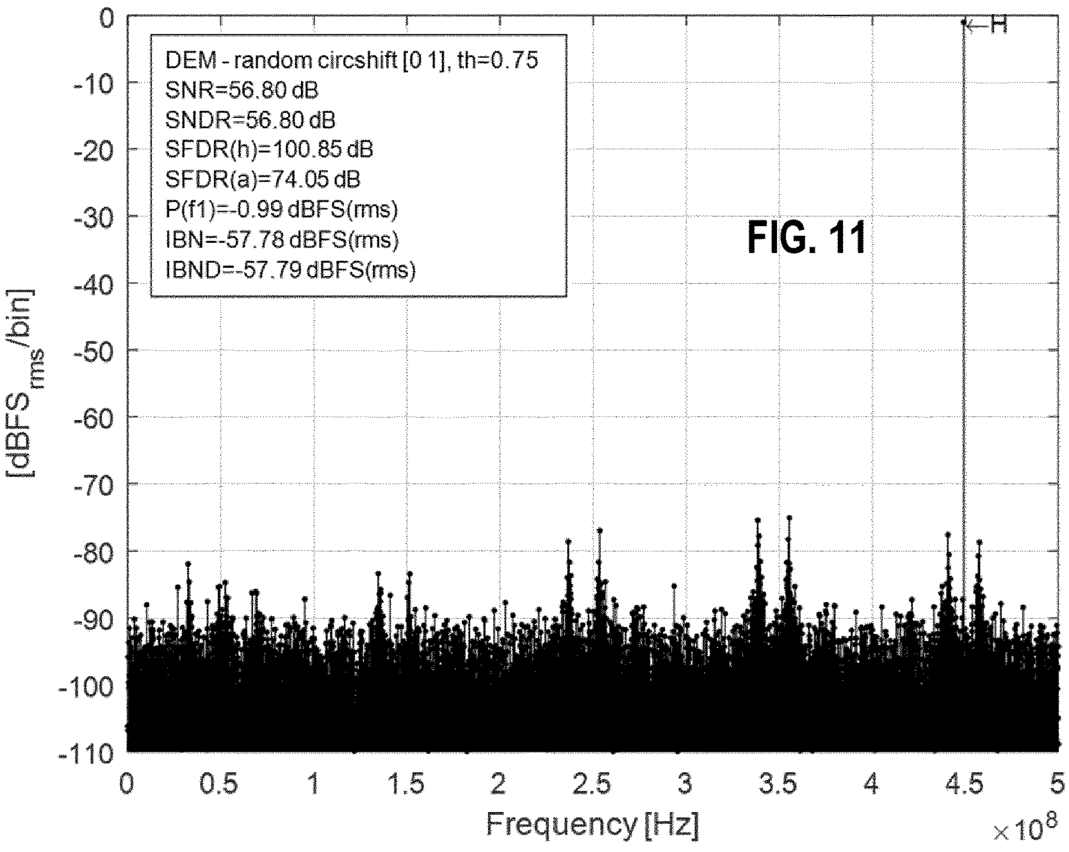
FIG. 11 shows the output signal spectrum for the same unit cell mismatch and using the techniques described herein, for a 25% probability of shift at each shift opportunity.

FIG. 11 shows an example spectrum using the proposed DEM technique, with a threshold equal to 0.75, meaning the probability for a shift in the circular shift register at any given sample time is only 25%. In this latter case, the spurs or noise humps are clearly higher than in the case illustrated by FIG. 10, where a threshold of 0.5 is used, but they also end up at different frequencies. This demonstrates that the threshold value can be used as a means of frequency planning, when the locations of desired signals and interfering signals are known. For example, the noise humps can be steered away from the frequencies occupied by harmonics and intermodulation distortion of desired and/or interfering signals.

When no DEM technique is applied, as illustrated in FIG. 8, one sees several strong undesired frequency components, with the $3^{rd}$ and $5^{th}$ harmonics being the strongest. When the maximally flat DEM is used, all harmonics are in the noise floor, and the noise floor is essentially flat over frequency. Using the proposed DEM technique, the harmonics are in the noise floor, but there are other artifacts manifested as humps of noise at a few different locations. What is important to note here is that these humps stem from the characteristics of the DEM randomization. While the occurrence or not of a shift at a given sample time is random, the register data is only shifted in one direction and with some average speed. That average speed is half the sampling rate when the threshold equals 0.5, and can be slower or faster, for higher or lower values of the threshold.

For a more complete quantitative evaluation 1000 realizations have been simulated for the three cases (no DEM, maximally randomized DEM, proposed technique) and various performance metrics have been recorded. For each realization the bit association pattern is randomized as well as the amplitude of the input signal, between −20 dBFS and −1 dBFS.

Figure 12:
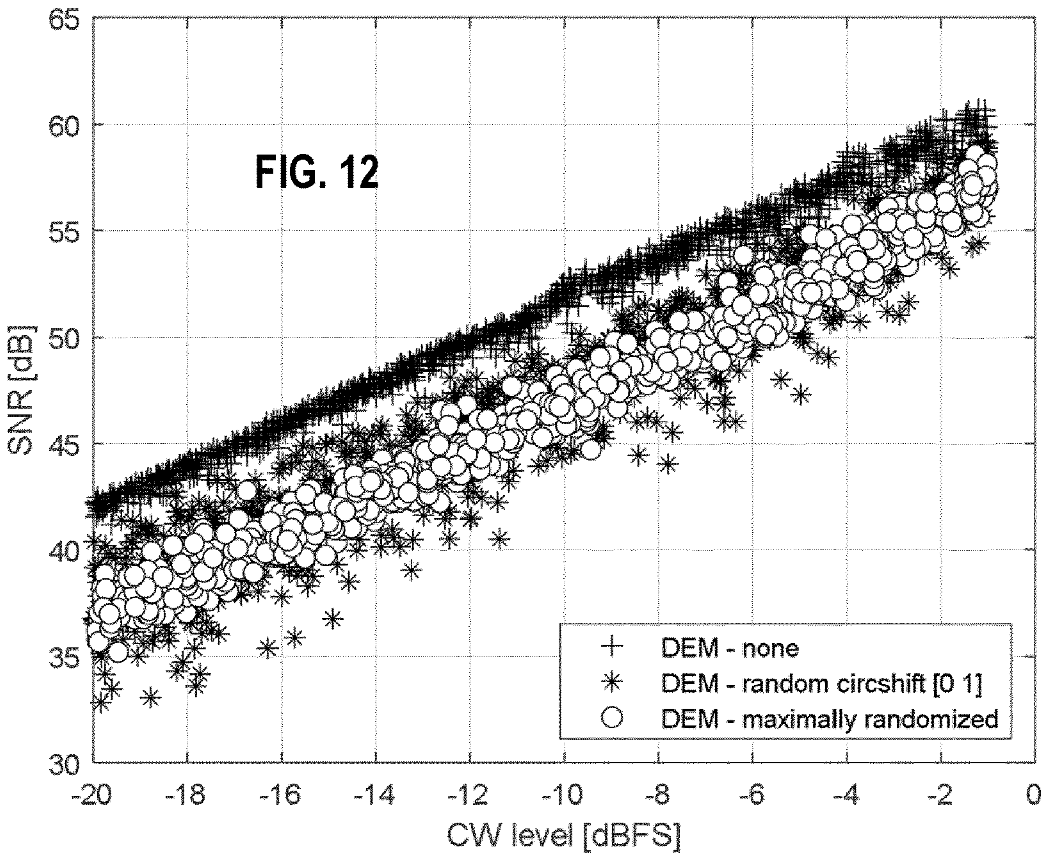
FIG. 12 illustrates an example of signal-to-noise ratio (SNR) for three cases.

FIG. 12 shows SNR that clearly demonstrates the impact from using DEM where harmonics due to unit cell mismatch is scrambled into noise when DEM is used (hence lowering the SNR) and where the proposed technique is on average similar to maximally randomized DEM although with some larger variation.

Figure 13:
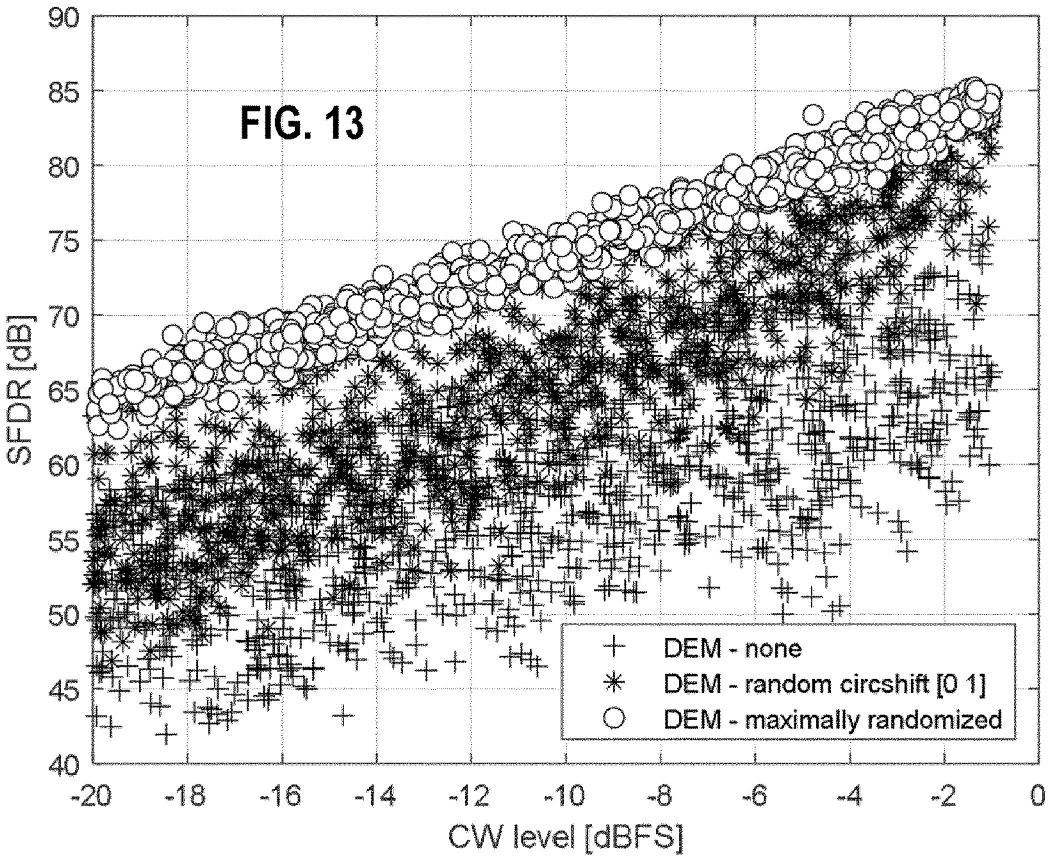
FIG. 13 illustrates an example of spurious-free dynamic range (SFDR) for three cases.
Figure 14:
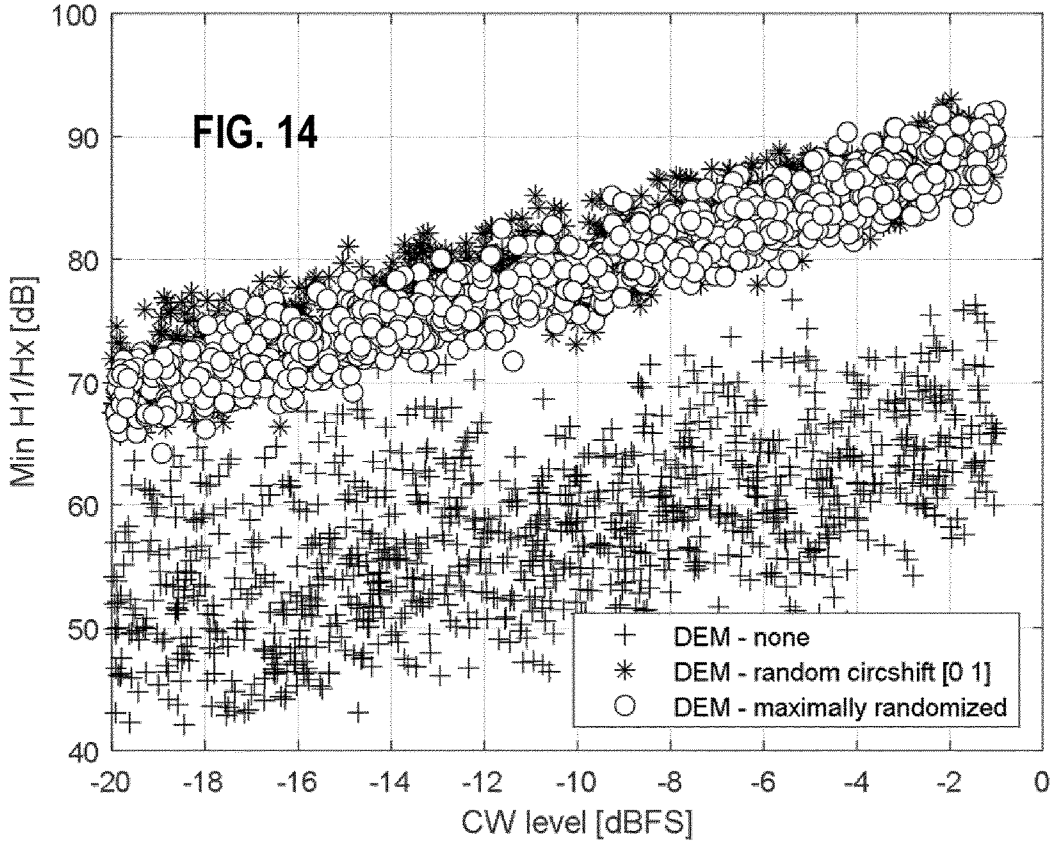
FIG. 14 illustrates worst-case SFDR for three cases, when considering only harmonics versus signal level.

FIG. 13 shows SFDR based on any kind of worst-case spur, harmonic or other, shows maximally randomized DEM yields highest SFDR followed by proposed DEM technique being some 10 dB worse while without DEM it is, as expected, much worse. In addition, the highest SFDR achieved in FIG. 13 with maximally randomized DEM also illustrates the potential of having an optimal initial state in the circular shift register, hence has the potential to increase the mean SFDR up to some 10 dB in theory, but in practice less since the exact amount will depend on the nature, severity, and correlation of errors in the DAC unit cells after process manufacturing. This observation leads an embodiment of the invention that includes means for finding the optimal or near-optimal initial bit association pattern before using the ADC to convert desired signals and where the application of the proposed DEM technique based on a circular shift register becomes optional. To find the optimal bit association pattern an accurately known test signal, e.g., a single tone with known frequency, is converted by the ADC, the ADC output is used to estimate a performance metric representing the level of nonlinear distortion, e.g., SFDR defined as the ratio in power between the desired tone and the largest non-desired tone. This may include calculating the FFT of a sequence of ADC output samples to yield a spectrum from which the desired metric can be estimated. The measurement is repeated for all possible or a subset of all possible bit association patterns. The bit association pattern that yields the highest SFDR, or other metric indicative of linearity, is then chosen for subsequent use. During the measurements the proposed DEM technique may optionally be used. FIG. 14 shows SFDR based on only harmonic distortion products, which shows proposed DEM technique is on par with maximally randomized DEM, while without DEM it is, again as expected, much worse.

Figure 15:
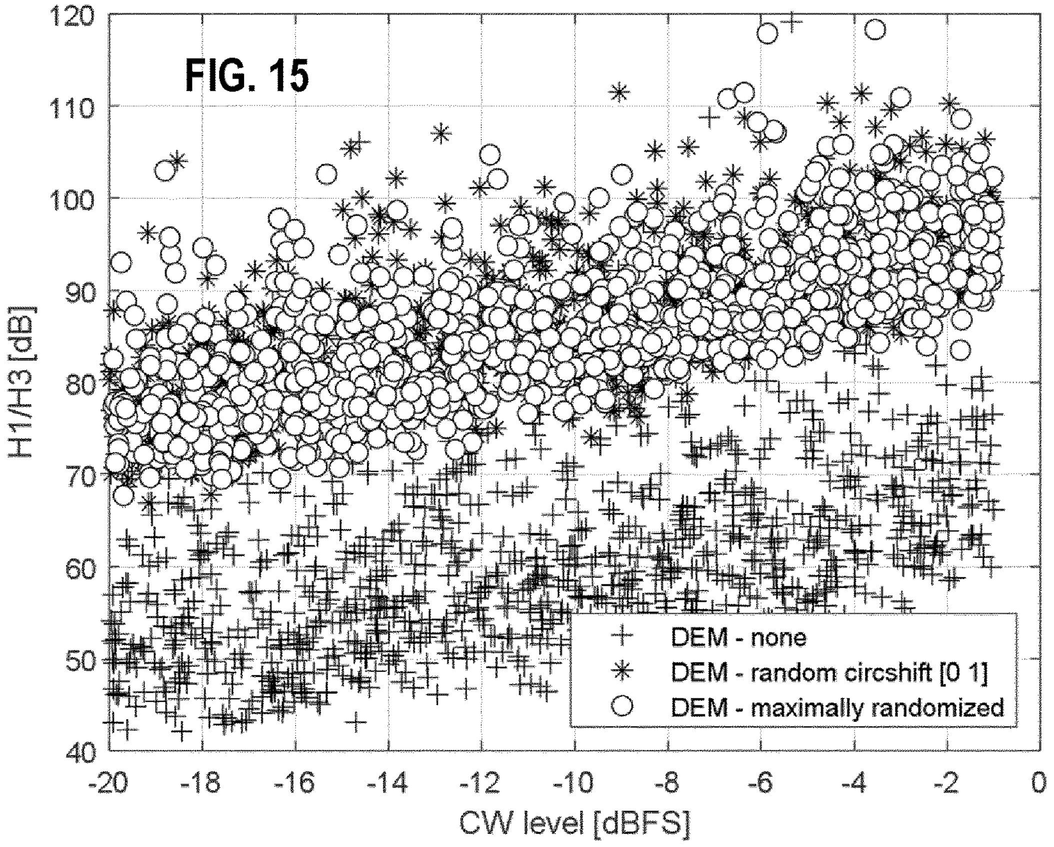
FIG. 15 illustrates worst-case SFDR for three cases, when considering only third harmonics versus signal level.

FIG. 15 shows SFDR based on $3^{rd}$ order harmonics distortion only which again is in line with FIG. 14.

The results in FIG. 14 and FIG. 15 are the most important results. The main ADC may exhibit a nonlinearity that can be represented by a polynomial, e.g., because of an amplifier included the ADC, or may exhibit static bit-weight errors (yielding a nonlinearity that typically cannot be represented by a polynomial). In both cases, this leads to harmonic distortion with a single input tone, intermodulation distortion with a multi-tone input, etc. When the reference ADC is used for the purpose of estimating this distortion (e.g., by reproducing harmonics with a single-tone input signal), for the purpose of generating parameters to post-correct the nonlinearity of the main ADC, the errors introduced in the reference ADC with the DEM technique described herein, will not be correlated with the input signal or the nonlinear distortion components that the reference ADC is seeking to estimate, and hence will not bias the estimation. The effect of the errors introduced by mismatched unit weights will be equivalent to measurement noise, because of the spreading performed by the DEM technique.

It is worth mentioning that if the scheduling in time of the reference ADC is not periodic (equidistant in time) but according to an irregular (random) pattern, the decorrelation effect will become even larger.

In view of the detailed examples and explanation provided above, it will be appreciated that example implementations of the presently disclosed techniques include a switched-element digital-to-analog converter (DAC) circuit, comprising a pool of unary circuit elements, where each unary circuit elements have a common nominal weighting value. These unary circuit elements might be unit capacitor elements, for instance, each having the same nominal value, but having slight differences in capacitance due to process limitations.

The example switched-element DAC circuit further comprises a switching arrangement of one or more switches, for each unary circuit element in the pool, where each switching arrangement is configured to independently and selectively connect the respective unary circuit element to a first circuit node, e.g., in a simple implementation where the switching arrangement (in this case consisting of a single switch) either connects the unit weighting element into the circuit or leaves it open, or to one of a set of nodes including first and second circuit nodes, in either case under the control of one or more respective control inputs to the switching arrangement. In one example, e.g., in a switched-capacitor DAC, the switching arrangement might be arranged to selectively connect a given unit capacitor to one of three nodes: a positive reference voltage node, a negative reference voltage node, and a neutral node. In implementations where the switched-element DAC is used in an SAR ADC, for example, the switching arraignment might be further configured to allow the unary circuit element to be selectively connected to the analog input voltage as well. Thus, the switching arrangement might resemble the 4-to-1 multiplexer arrangement illustrated in the example DAC circuit shown in FIG. 2, in some embodiments. Together, each switching arrangement and respective unary circuit element might be referred to as a "unit weight," as in the unit weights labeled "uw" in FIG. 4A.

A key aspect of the disclosed techniques is to allow each unary circuit element to be assigned, dynamically, to one of two or more bits, so as to facilitate the DEM techniques described herein. To this end, the example switched-element DAC circuit further comprises a multiplexer for each respective unary circuit element in the pool, as shown in FIG. 4A. Each of these multiplexers has one or more output lines connected to respective ones of the one or more control inputs of the switching arrangement corresponding to the respective unary circuit element. These are shown in FIG. 4A as the control lines labeled c_uc and d_uc. As noted above, there may be more, or fewer, control lines per unary circuit element in various embodiments.

Each multiplexer also has two or more sets of input lines, each set having input lines corresponding in number to the number of the one or more output lines. In FIG. 4A, these are the switch control lines labeled c[0:N−1] and d[0:N−1]. A given pair c[i] and d[i] of these switch control lines makes up one of these sets—there is a separate set for each of two or more bits of the switched-element DAC, i.e., N sets for N bits. Finally, each multiplexer also has one or more input selection lines, shown in FIG. 4A as the select lines labeled "sel," each multiplexer being configured such that signal values applied to the input selection lines control which one of the two or more sets of input lines is connected to the respective one or more output line.

The example switched-element DAC circuit further comprises a shift register circuit having a register element for each one of the plurality of multiplexers. Each register element in turn has one or more register element lines connected to respective ones of the one or more input selection lines for the respective multiplexer (the lines labeled "sel" in FIG. 4A), and the register elements are configured in a loop configuration so that each cycle of a shift register clock signal, shown as signal r_clk in FIG. 4A, shifts signal values output by register element lines of a given one of the register elements to a next-in-line one of the register elements. Preferably, each of at least most of the register elements is physically adjacent to its next-in-line register element, so as to minimize routing complexity.

In this example arrangement, the two or more sets of input lines for each multiplexer comprise a set of input lines for each of two or more bits of the switched-element DAC, such that the signal values applied to the input selection lines of the multiplexers select which of the unary circuit elements are associated with which of the two or more bits. In other words, the "sel" lines output by each register element associate the respective unary circuit element with a given bit, as these "sel" lines map the control inputs from a given one of the N bits to the switching arrangement associated with the unary circuit element. Accordingly, any unary circuit element can be mapped, or "assigned," to a given bit of the DAC, at any given time. These mappings are changed, at each pulse of the register clock signal, in such a way that the mappings are propagated from one unary circuit element to the next-in-line unary circuit element, according to a loop formed by the arrangement of register elements in the circular shift register.

As noted above, this example switched-element DAC circuit might utilize unit capacitors for the unary circuit elements, where each capacitor has a common (i.e., the same) nominal capacitance. In some of these switched-capacitor DAC circuits, a first end of each of these unit capacitors may be electrically connected to a common circuit node, while the second is connected to the switching arrangement corresponding to the unary circuit element. In these embodiments, each switching arrangement may be configured to selectively connect the respective unary circuit element to one of a set of nodes that includes a first circuit node configured for connecting to a first voltage and a second circuit node configured for connected to a second voltage. The first and second voltages might be, for example, a positive reference voltage and a negative reference voltage. In some implementations, e.g., where the switched-element DAC forms part of a SAR ADC, the set of nodes may further include a third circuit node configured for connecting to an analog input signal. In some of these embodiments, the set of nodes might further include a fourth circuit node configured for connecting to a fourth voltage, intermediate the first and second voltages, e.g., a "neutral" voltage.

The techniques and circuit arrangements discussed above might be implemented as a stand-alone DAC, in some embodiments. In others, the circuit arrangements described above might form part of a SAR ADC.

In some of these latter embodiments, the SAR ADC circuit may comprise additional digital circuitry configured to pre-load the register elements with output signal values in such a manner that a first number of unary circuit elements are associated with a first bit of the SAR ADC circuit and a second number of unary circuit elements, differing from the first number, are associated with a second bit, and so on, for each of any more of the two or more bits. In the simplest case, the SAR ADC is binary weighted, such that the first number is twice the second number and the number for any additional bits is a different power of two times the first number, but different weights are possible.

In some embodiments, this additional digital circuitry is configured to pre-load the register elements with output signal values by loading a value into a first one of the register elements, controlling the shift register clock signal to shift signal values output by the register elements to next-in-line register elements, and repeating this loading and controlling operation until all of the register elements are pre-loaded. This can be accomplished, for example, by inserting an additional mux between two of the register points, to form an entry point to the loop for entering a sequence of output signal values to be clocked through the circular shift register. As discussed above, however, other arrangements are possible, including arrangements where all (or some subset) of the register elements are loaded with initial values simultaneously.

The SAR ADC circuits described above may further include clock circuitry configured to generate the shift register clock signal so that each cycle of the clock register signal corresponds to an integer number of sampling cycles of the SAR ADC circuit. Put differently, this means that the shift register clock signal need not cycle (causing the contents of each register element to shift to the next element) at every sampling instance, but may instead occur less frequently than at every sampling instance. In some embodiments, the clock circuity may be configured so that whether the shift register clock signal cycles the shift register at a given sample instance is probabilistic, e.g., according to a random or pseudo-random sequence.

The SAR ADC circuit described above may be a stand-alone ADC, in various embodiments or implementations. In others, the SAR ADC may be part of an ADC system, where the SAR ADC circuit described above may be a reference ADC. Thus, an analog-to-digital converter (ADC) circuit, or ADC system, may comprise a primary ADC circuit and a reference ADC circuit configured to operate in parallel with the primary ADC circuit, on the same analog signal input to the primary ADC or on a scaled version of the analog signal input to the primary ADC, where the reference ADC is configured according to any of the example SAR ADCs described above. This reference ADC might be configured to operate at a lower sample rate than the primary ADC, for example. In some embodiments, the primary ADC circuit might be a time-interleaved ADC.

Figure 16:
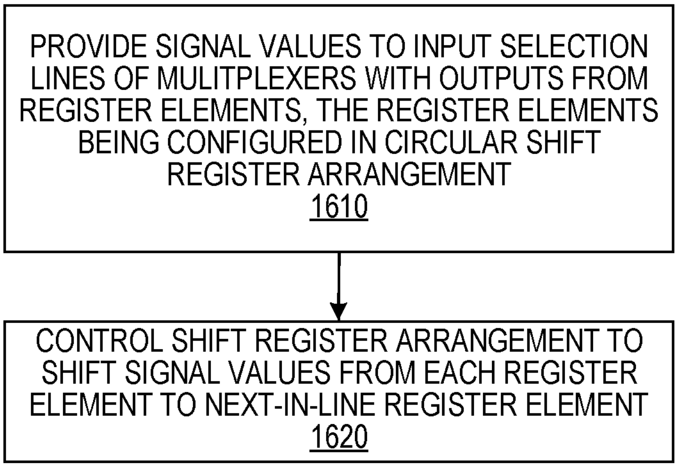
FIG. 16 is a process flow diagram illustrating an example method according to the techniques described herein.

Corresponding to the circuits described above are complementary methods for operating a switched-element digital-to-analog converter (DAC) circuit, where the switched-element DAC comprises a pool of unary circuit elements, each having a common nominal weighting value as described above, and where the switched-element DAC further comprises respective switching arrangements and multiplexers configured such that signal values applied to input selection lines of each multiplexer control, for the respective unary circuit element, to which of two or more bits of the switched-element DAC circuit the unary circuit element is associated. An example of such a method is illustrated in FIG. 16 and comprises the step of providing the signal values to the input selection lines of each multiplexer with outputs from register elements corresponding to the multiplexers, the register elements being configured in a circular shift register arrangement such that the register elements form a loop, with respect to the shift register arrangement. This step is shown at block 1610. As shown at block 1620, the method further comprises controlling a shift register arrangement to shift the signal values output from the register elements so that the signal values output from each register element are shifted to a next-in-line register element in the loop.

The method shown in FIG. 16 may be implemented using any of the various circuits described herein, including circuits where the DAC is comprised in a SAR ADC circuit. In some such implementations, the method may further comprise pre-loading the register elements with output signal values, prior to the "controlling" step shown at block 1610, such that a first number of unary circuit elements are associated with a first bit of the SAR ADC circuit and a second number of unary circuit elements, differing from the first number, are associated with a second bit, and so on, for each of any more of the two or more bits. This may comprise, in some implementations, loading a value into a first one of the register elements, controlling a shift register clock signal to shift signal values output by the register elements to next-in-line register elements, and repeating said loading and controlling until all of the register elements are pre-loaded.

In various embodiments or instances, controlling the shift register arrangement may comprise generating a shift register clock signal for triggering shifts from the register elements to the next-in-line register elements such that each cycle of the clock register signal corresponds to an integer number of sampling cycles of the SAR ADC circuit. This generating may comprise generating the shift register clock signal so that whether the shift register clock signal triggers shifts by the shift register circuit at a given sample instance is probabilistic, according to a random or pseudo-random sequence.

In view of the detailed examples and explanation provided above, it will be appreciated that embodiments of the presently disclosed circuits can be used to produce an ADC system with a main ADC and a reference ADC, the latter based on a SAR ADC, where the reference ADC exhibits a substantially better linearity than the main ADC, and where the reference ADC output is used to provide a more linear representation of the input signal compared to the main ADC. This will be used as reference when estimating at least nonlinearity in the main ADC.

A low-complexity DEM technique described herein may be used in the reference SAR ADC. The low-complexity DEM technique is based on each unit cell in SAR ADC having a unit cell register associating said each unit cell to one decision bit d[k], where randomization is limited to either keeping a unit cell register setting or shifting the unit cell register value to the adjacent unit cell, for all unit cells. Thus, unit cells form a cyclic shift register.

Various embodiments of the presently disclosed circuits may include some, many, or all of the following features:

a. A SAR-based ADC within which the DAC has M unit cells and controlled by $N_b$ decision bits from the SAR ADC register.
b. At least two unit cells that are reconfigurable such that each of the at least two unit cells can be associated to one out of at least two of the $N_b$ decision bits.
c. Said at least two unit cells each having an associated unit cell register storing the decision bit association, and an associated mux forwarding decision bits based on decision bit association in unit cell register.
d. After converting a first input signal sample, bit association for at least one unit cell is reconfigured to be used for conversion of a subsequent second input signal sample, and where the new bit association configuration to be stored in the register of a first unit cell is always obtained from the register of a same second unit cell (implicitly forming a circular shift register)
e. A sequence generator controls, after converting a first sample, whether a bit association reconfiguration should take place or not before conversion of a subsequent second input signal sample by issuing a register shift signal (r_clk).
f. A SAR-based ADC having reset period (resetting capacitors in C-DAC) after end of conversion of a sample and before start of starting sampling of subsequent sample and where bit association reconfiguration at least partially overlaps with the reset period and completes before reset period ends.
g. A sequence generator that can be reconfigured to generate different sequence pattern based on known frequency ranges of at least one of desired carriers and interfering carriers.
h. The sequence generator, unit cell registers, and bit association muxes form a low complexity DEM.
i. A pipelined SAR ADC containing at least two SAR-based ADCs with a pipeline stage in between.
j. The SAR ADC or pipelined SAR ADC is a reference ADC within an ADC having a main ADC and a reference ADC, where reference ADC is used for estimation of errors in main ADC or estimation of parameters to post-correct said errors, including at least nonlinearity.
k. First and second differential sections of a C-DAC in SAR ADC with p and m section having first and second low complexity DEM, respectively.
l. The first and second differential sections above, where first and second low-complexity DEM have different sequence generator patterns.
m. The first and second low-complexity DEM above, where shifting is done in opposite directions with respect to the unit cell layout order in first and second differential sections.
n. The first and second differential sections above, with a single sequence generator and where first and second differential sections are connected in series to form a combined cyclic shift register.
o. A sequence generator having a reconfigurable threshold to control the statistical distribution of shift and no-shift outputs.
p. The sequence generator above, where the threshold is controlled based on at least one frequency range of at least one of a desired carriers and interfering carriers.
q. Any of the above where the SAR-based ADC operation is momentarily halted after which the cyclic shift register is loaded with a new initial bit association pattern different from the previously loaded initial bit association pattern, after which ADC operation is recommenced.

Figure 17:
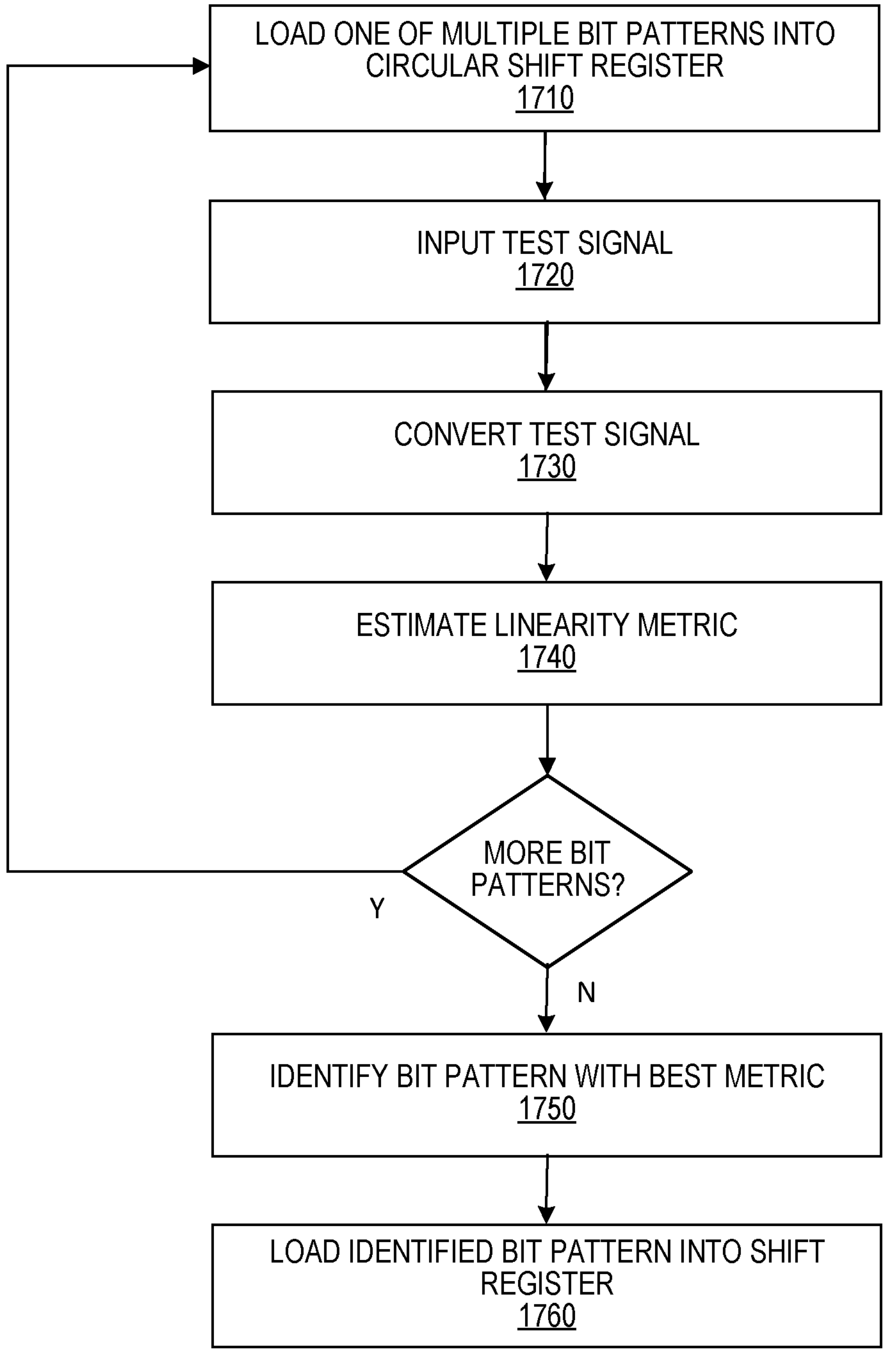
FIG. 17 is a process flow diagram illustrating another example method according to techniques described herein.

In view of the detailed techniques described above, it should also be appreciated that FIG. 17 illustrates an example method for identifying and employing an optimal bit association pattern, according to some embodiments. The method begins, as shown at block 1710 with loading, into a circular shift register in a SAR DAC circuit forming part of an ADC as described above, a first bit association pattern. The method continues with the inputting of a test signal, as shown at block 1720. The test signal is converted by the ADC, as shown at block 1730, and a linearity metric for the output signal is estimated, as shown at block 1740.

The steps shown at blocks 1710-1740 may be repeated, for each of one or more additional bit association patterns. Then, the bit association pattern with the best linearity is identified, as shown at block 1750. That bit association pattern is then loaded into the circular shift register, for subsequent operation of the ADC.

In conclusion, the DEM techniques described above can be used in a reference ADC used for nonlinearity estimation, leading to low impacts with regards to the SAR operation speed, power consumption and size of the DEM machinery. These techniques can provide large improvements in linearity, while using a small layout and low speed impact on the SAR conversion loop. The low-complexity DEM spectral noise produced with circuits using these techniques is not perfectly flat over frequency, but may contain several humps. However, for the reasons discussed above, these humps are not correlated with the input signal or with the harmonic/intermodulation distortion produced by the ADC and thus will have the same effect as any other noise, from the perspective of nonlinear distortion estimation.

What is claimed is:

1. A switched-element digital-to-analog converter (DAC) circuit, comprising:

a pool of unary circuit elements, each having a common nominal weighting value;

a switching arrangement of one or more switches, for each unary circuit element in the pool, each switching arrangement being configured to independently and selectively connect the respective unary circuit element to a first circuit node or to one of a set of nodes that includes first and second circuit nodes, under the control of one or more respective control inputs to the switching arrangement;

a multiplexer for each respective unary circuit element in the pool, each multiplexer having (a) one or more output lines connected to respective ones of the one or more control inputs of the switching arrangement corresponding to the respective unary circuit element, (b) two or more sets of input lines, each set having input lines corresponding in number to the number of the one or more output lines, and (c) one or more input selection lines, each multiplexer being configured such that signal values applied to the input selection lines control which one of the two or more sets of input lines is connected to the respective one or more output lines; and a shift register circuit comprising a register element for each one of the plurality of multiplexers, each register element having one or more register element lines connected to respective ones of the one or more input selection lines for the respective multiplexer, the register elements being configured in a loop configuration so that each cycle of a shift register clock signal shifts signal values output by register element lines of a given one of the register elements to a next-in-line one of the register elements;

wherein the two or more sets of input lines for each multiplexer comprise a set of input lines for each of two or more bits of the switched-element DAC, such that the signal values applied to the input selection lines of the multiplexers select which of the unary circuit elements are associated with which of the two or more bits.

2. The switched-element DAC circuit of claim 1, wherein:

each unary circuit element comprises a capacitor having a common nominal capacitance;

a first end of each of the capacitors is electrically connected to a common circuit node and a second end is connected to the switching arrangement corresponding to the unary circuit element; and each switching arrangement is configured to selectively connect the respective unary circuit element to one of a set of nodes that includes a first circuit node configured for connecting to a first voltage and a second circuit node configured for connected to a second voltage.

3. The switched-element DAC circuit of claim 2, wherein the set of nodes further includes a third circuit node configured for connecting to an analog input signal.

4. The switched-element DAC circuit of claim 3, wherein set of nodes further includes a fourth circuit node configured for connecting to a fourth voltage, intermediate the first and second voltages.

5. A successive-approximation register (SAR) analog-to-digital converter (ADC) circuit comprising the switched-element DAC circuit of claim 3.

6. The SAR ADC circuit of claim 5, further comprising digital circuitry configured to pre-load the register elements with output signal values such that a first number of unary circuit elements are associated with a first bit of the SAR ADC circuit and a second number of unary circuit elements, differing from the first number, are associated with a second bit, and so on, for each of any more of the two or more bits.

7. The SAR ADC circuit of claim 6, wherein the SAR ADC is binary weighted, such that the first number is twice the second number and the number for any additional bits is a different power of two times the first number.

8. The SAR ADC circuit of claim 6, wherein the digital circuitry is configured to pre-load the register elements with output signal values by loading a value into a first one of the register elements, controlling the shift register clock signal to shift signal values output by the register elements to next-in-line register elements, and repeating said loading and controlling until all of the register elements are pre-loaded.

9. The SAR ADC circuit of claim 5, further comprising clock circuitry configured to generate the shift register clock signal so that each cycle of the clock register signal corresponds to an integer number of sampling cycles of the SAR ADC circuit.

10. The SAR ADC circuit of claim 9, wherein the clock circuitry is configured to generate the shift register clock signal so that whether the shift register clock signal cycles the shift register circuit at a given sample instance is probabilistic, according to a random or pseudo-random sequence.

11. An analog-to-digital converter (ADC) circuit, comprising a primary ADC circuit and a reference ADC circuit configured to operate in parallel with the primary ADC circuit, on the same analog signal input to the primary ADC or on a scaled version of the analog signal input to the primary ADC, wherein the reference ADC comprises the SAR ADC circuit of claim 5.

12. The ADC circuit of claim 11, wherein the reference ADC is configured to operate at a lower sample rate than the primary ADC.

13. The ADC circuit of claim 11, wherein the primary ADC circuit is a time-interleaved ADC.

14. A method of operating a switched-element digital-to-analog converter (DAC) circuit, where the switched-element DAC comprises a pool of unary circuit elements, each having a common nominal weighting value, and respective switching arrangements and multiplexers configured such that signal values applied to input selection lines of each multiplexer control, for the respective unary circuit element, to which of two or more bits of the switched-element DAC circuit the unary circuit element is associated, the method comprising:

providing the signal values to the input selection lines of each multiplexer with outputs from register elements corresponding to the multiplexers, the register elements being configured in a circular shift register arrangement, such that the register elements form a loop, with respect to the shift register arrangement; and controlling a shift register arrangement to shift the signal values output from the register elements so that the signal values output from each register element are shifted to a next-in-line register element in the loop.

15. The method of claim 14, wherein the DAC is comprised in a successive-approximation register (SAR) analog-to-digital converter (ADC) circuit.

16. The method of claim 15, further comprising, prior to said controlling, pre-loading the register elements with output signal values such that a first number of unary circuit elements are associated with a first bit of the SAR ADC circuit and a second number of unary circuit elements, differing from the first number, are associated with a second bit, and so on, for each of any more of the two or more bits.

17. The method of claim 15, wherein said pre-loading comprises loading a value into a first one of the register elements, controlling a shift register clock signal to shift signal values output by the register elements to next-in-line register elements, and repeating said loading and controlling until all of the register elements are pre-loaded.

18. The method of claim 15, wherein said controlling the shift register arrangement comprises generating a shift register clock signal for triggering shifts from the register elements to the next-in-line register elements such that each cycle of the clock register signal corresponds to an integer number of sampling cycles of the SAR ADC circuit.

19. The method of claim 18, wherein said generating the shift register clock signal comprises generating the shift register clock signal so that whether the shift register clock signal triggers shifts by the shift register circuit at a given sample instance is probabilistic, according to a random or pseudo-random sequence.

* * * * *